(12) United States Patent
Inoue

(10) Patent No.: US 9,154,063 B2
(45) Date of Patent: Oct. 6, 2015

(54) CIRCUIT DEVICE AND ELECTRONIC APPARATUS

(71) Applicant: SEIKO EPSON CORPORATION, Tokyo (JP)

(72) Inventor: Katsumi Inoue, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 50 days.

(21) Appl. No.: 14/218,610

(22) Filed: Mar. 18, 2014

(65) Prior Publication Data

US 2014/0285130 A1    Sep. 25, 2014

(30) Foreign Application Priority Data

Mar. 25, 2013   (JP) ................................. 2013-061552

(51) Int. Cl.
*H02P 6/08* (2006.01)
*H02M 7/5387* (2007.01)
*H03K 17/06* (2006.01)
*H03K 17/16* (2006.01)
*H02P 7/285* (2006.01)
*H02M 3/155* (2006.01)

(52) U.S. Cl.
CPC .............. *H02P 6/085* (2013.01); *H02M 7/5387* (2013.01); *H02P 7/285* (2013.01); *H03K 17/06* (2013.01); *H03K 17/165* (2013.01); *H02M 2003/1555* (2013.01); *H03K 2217/0045* (2013.01)

(58) Field of Classification Search
CPC ....... H02P 6/085; H02P 6/002; H02P 7/0044; H02M 1/38; H03K 17/687; H03K 2217/0063; H03K 2217/0081
USPC ............. 318/400.17, 400.26, 400.27, 400.29; 327/108, 112
See application file for complete search history.

(56) References Cited

U.S. PATENT DOCUMENTS

| 7,477,082 B2 * | 1/2009 | Fukazawa ...................... 327/108 |
| 8,222,846 B2 * | 7/2012 | Sugie ......................... 318/400.29 |
| 8,390,222 B2 * | 3/2013 | Seki et al. ................. 318/400.01 |
| 8,390,341 B2 * | 3/2013 | Sugie ............................. 327/112 |

FOREIGN PATENT DOCUMENTS

| JP | A-2003-189683 | 7/2003 |
| JP | B2-3899926 | 3/2007 |
| JP | A-2008-42975 | 2/2008 |

* cited by examiner

*Primary Examiner* — Bentsu Ro
*Assistant Examiner* — Thai Dinh
(74) *Attorney, Agent, or Firm* — Oliff PLC

(57) ABSTRACT

When a counter-electromotive force generated by an inductive load is applied to the drain of a switch element, the gate of the switching element may pull the gate potential toward the direction opposite to its original potential due to capacitance coupling of the drain-gate capacitance, and this may cause a malfunction. To cope with this, a switch element that pulls the potential to the reverse direction is provided and controlled to turn on at timing at which the counter-electromotive force is applied.

12 Claims, 17 Drawing Sheets

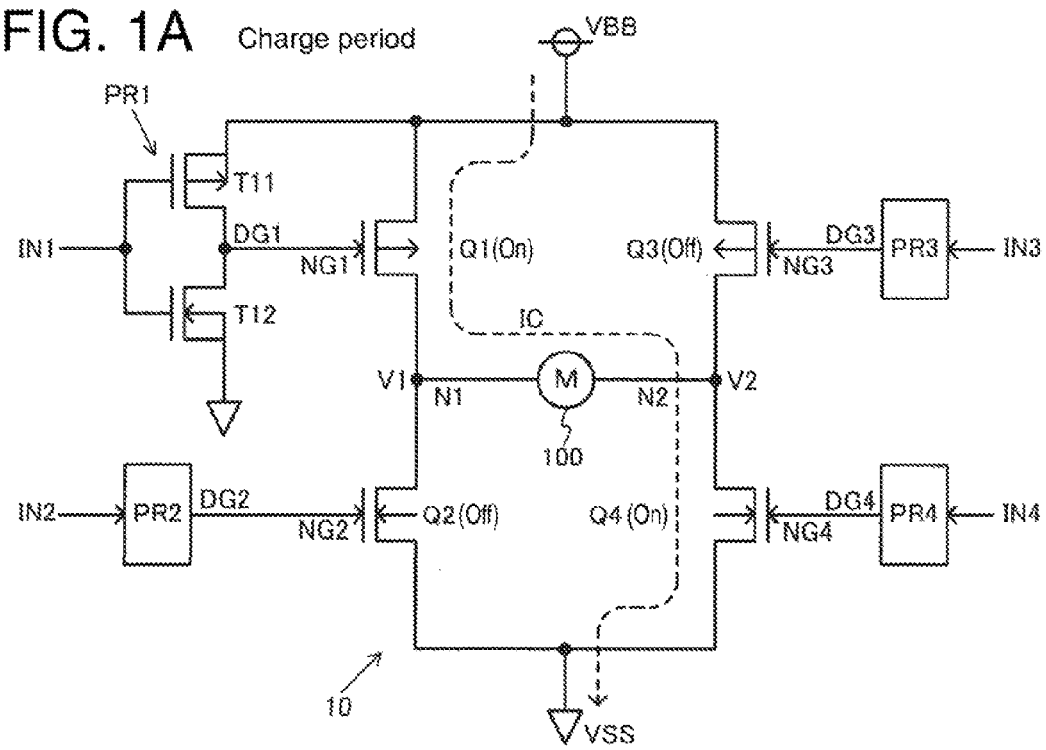
FIG. 1A Charge period
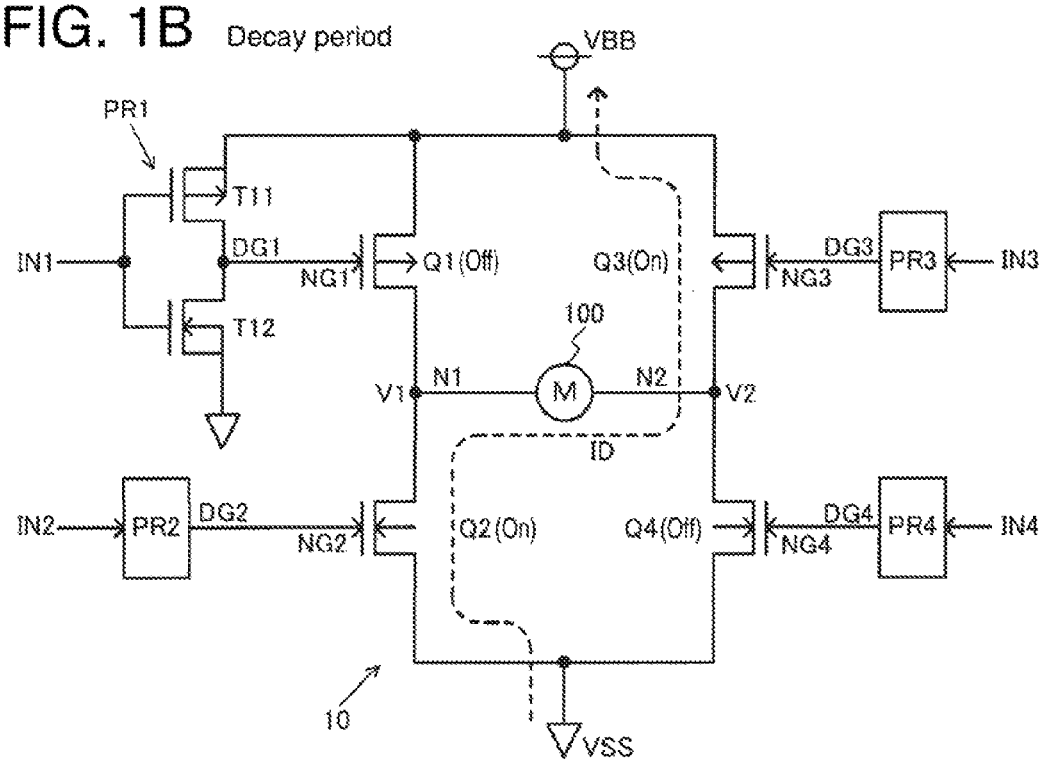
FIG. 1B Decay period

CIRCUIT DEVICE AND ELECTRONIC APPARATUS

BACKGROUND

1. Technical Field

The present invention relates to a circuit device and an electronic apparatus or the like.

2. Related Art

A technique of controlling the number of revolutions of a motor by controlling a chopping current is known as a technique for a motor driver that drives a DC motor. In this technique, a current flowing to an H-bridge circuit is converted to a voltage by a sense resistor, and the resultant voltage is compared with a reference voltage, to detect a chopping current. The detection result is fed back to a control circuit, to perform PWM control of a drive signal for the bridge circuit, thereby rotating a motor at a fixed rate. As such techniques for a motor driver, the techniques disclosed in JP-A-2003-189683 and JP-A-2008-042975 are known.

The H-bridge circuit of the motor driver has first to fourth transistors (switching elements) for driving, where the first and fourth transistors, and the second and third transistors, are connected electrically diagonally with respect to the motor. During the charge period, the first and fourth transistors are on, whereby the positive-side (+) terminal of the motor is set to a high-potential voltage and the negative-side (−) terminal is set to a low-potential voltage. During the decay period, the second and third transistors are on, whereby the positive-side terminal of the motor is set to a low-potential voltage and the negative-side terminal is set to a high-potential voltage.

When the period is switched from the charge period to the decay period as described above, an abrupt voltage change occurs at a node of a terminal of the motor. In this case, a gate capacitance (gate-drain capacitance) is present in a transistor for driving. It has been therefore found that, when an abrupt voltage change occurs at a node of a terminal of the motor, this voltage change is conveyed to the gate node of the transistor for driving via the gate capacitance, raising an abnormal condition such as that so-called self-turn-on occurs causing flow of a through current.

SUMMARY

An advantage of some aspects of the invention is providing a circuit device and an electronic apparatus or the like where occurrence of an abnormal condition caused by self-turn-on, etc. of a transistor of a bridge circuit can be prevented or reduced.

According to a first aspect of the invention, a circuit device includes a bridge circuit of an H-bridge type or a half-bridge type having a P-type first transistor provided between a node of a high-potential side power supply and a first node and an N-type second transistor provided between the first node and a node of a low-potential side power supply, a pre-driver circuit that outputs a first drive signal and a second drive signal to a first gate node of the first transistor and a second gate node of the second transistor, respectively, a first switch circuit provided between the node of the high-potential side power supply and the first gate node of the first transistor, and a control circuit that performs on/off control of the first switch circuit, wherein the control circuit keeps the first switch circuit off during a period when the pre-driver circuit is outputting a low level of the first drive signal to the first gate node of the first transistor, and turns on, from off, the first switch circuit when the pre-driver circuit has changed the first drive signal from the low level to a high level.

In the first aspect of the invention, the first switch circuit is provided between the node of the high-potential side power supply and the first gate node of the first transistor. The first switch circuit is off during the period when the low-level first drive signal is being output to the first gate node of the P-type first transistor. This makes it possible to prevent or reduce such a situation that a wasteful consumption current flows through the first switch circuit. Once the first drive signal changes from the low level to the high level, the first switch circuit is turned on from off. By doing so, even if a large voltage change occurs at the first node that is the drain node of the first transistor, for example, the first gate node is set to the voltage level of the high-potential side power supply by the first switch circuit. Thus, occurrence of an abnormal situation of self-turn-on of the first transistor can be prevented or reduced.

It is preferable that the control circuit turn on, from off, the first switch circuit at a given time after timing at which the pre-driver circuit has changed the first drive signal from the low level to the high level.

It is preferable that the control circuit turn off, from on, the first switch circuit at a given time before timing at which the pre-driver circuit changes the first drive signal from the high level, to the low level.

With the above configuration, it is possible to prevent or reduce such a situation that the on period of a transistor constituting the pre-driver circuit may coincide with the on period of the first switch circuit causing flow of a through current.

It is preferable that the circuit device further include a level shifter, the pre-driver circuit have a first pre-driver that outputs the first drive signal to the first gate node of the first transistor, and, assuming that the voltage of the high-potential side power supply is VBB, the voltage of the low-potential side power supply is VSS, and the voltage of a second low-potential side power supply located between the high-potential side power supply and the low-potential side power supply is VSS2 (VBB>VSS2>VSS), the first pre-driver output the first drive signal having an amplitude range of VBB to VSS2 to the first gate node of the first transistor, and the level shifter level-shift the amplitude range of a control signal that turns on/off the first switch circuit to an amplitude range of VBB to VSS2.

By level-shifting the amplitude range of the on/off control signal for the first switch circuit to an amplitude range of VBB to VSS2 by the level shifter as described above, occurrence of a transistor breakdown, etc. can be prevented or reduced even when the transistor constituting the first switch circuit is a low-voltage transistor, for example.

It is preferable that the first transistor and the second transistor be high-voltage transistors, and the transistors constituting the pre-driver circuit and the first switch circuit be low-voltage transistors.

By limiting the use of high-voltage transistors to the first and second transistors and using low-voltage transistors for the other circuits as described above, the size of the circuit device can be reduced.

It is preferable that the first transistor and the second transistor be transistors having a DMOS structure.

Using such a DMOS structure, the breakdown voltages of the first and second transistors can be made higher.

It is preferable that the circuit device further include a second switch circuit provided between the node of the low-potential side power supply and the second gate node of the second transistor, and the control circuit keep the second switch circuit off during a period when the pre-driver circuit is outputting a high level of the second drive signal to the second gate node of the second transistor, and turn on, from off, the second switch circuit when the pre-driver circuit has changed the second drive signal from the high level to a low level.

By keeping the second switch circuit off during the period when the high-level second drive signal is being output to the second gate node of the second transistor, such a situation that a wasteful consumption current flows through the second switch circuit can be prevented or reduced. Once the second drive signal changes from the high level to the low level, the second switch circuit is turned on, whereby an abnormal situation of self-turn-on of the second transistor can be prevented or reduced.

It is preferable that the control circuit turn on, from off, the second switch circuit at a given time after timing at which the pre-driver circuit has changed the second drive signal from the high level to the low level.

It is preferable that the control circuit turn off, from on, the second switch circuit at a given time before timing at which the pre-driver circuit changes the second drive signal from the low level to the high level.

With the above configuration, it is possible to prevent or reduce such a situation that the on period of a transistor constituting the pre-driver circuit may coincide with the on period of the second switch circuit causing flow of a through current.

It is preferable that the circuit device further include a detection circuit that detects a change in voltage level at the first gate node of the first transistor, and the control circuit generate a control signal that turns on/off the first switch circuit based on a detection result from the detection circuit.

With the above configuration, it is possible to detect a change in voltage level at the first gate node of the first transistor and control on/off of the first switch circuit based on the detection result. Thus, a situation of self-turn-on of the first transistor can be prevented or reduced more reliably.

It is preferable that the bridge circuit be an H-bridge type bridge circuit further having a P-type third transistor provided between the node of the high-potential side power supply and a second node and an N-type fourth transistor provided between the second node and the node of the low-potential side power supply, the circuit device further include a third switch circuit provided between the node of the high-potential side power supply and a third gate node of the third transistor and a fourth switch circuit provided between the node of the low-potential side power supply and a fourth gate node of the fourth transistor, and the control circuit keep the third switch circuit off during a period when the pre-driver circuit is outputting a low level of a third drive signal to the third gate node of the third transistor, turn on, from off, the third switch circuit when the pre-driver circuit has changed the third drive signal from the low level to a high level, keep the fourth switch circuit off during a period when the pre-driver circuit is outputting a high level of a fourth drive signal to the fourth gate node of the fourth transistor, and turn on, from off, the fourth switch circuit when the pre-driver circuit has changed the fourth drive signal from the high level to a low level.

With the above configuration, even if an abrupt voltage change occurs at the second node, since the third and fourth switch circuits are turned on, occurrence of an abnormal situation of self-turn-on of the third and fourth transistors can be prevented or reduced.

According to a second aspect of the invention, an electronic apparatus includes the circuit device described above.

BRIEF DESCRIPTION OF THE DRAWINGS

The invention will be described with reference to the accompanying drawings, wherein like numbers reference like elements.

FIGS. 1A and 1B are explanatory diagrams of the operation of a bridge circuit.

DESCRIPTION OF EXEMPLARY EMBODIMENTS

The following describes in detail a preferred embodiment of the invention. It should be noted that the embodiment to be described hereinafter is not intended to unduly limit the scope of the invention defined by the appended claims and that the entire configuration to be described in the embodiment is not necessarily essential as the means for achieving the invention.

1. Bridge Circuit

First, the basic operation of a bridge circuit 10 will be described with reference to FIGS. 1A and 1B. The bridge circuit 10 has transistors Q1, Q2, Q3, and Q4 for driving a motor 100. Gate nodes NG1 to NG4 of these transistors Q1 to Q4 are driven with drive signals DG1 to DG4 from pre-drivers PR1 to PR4.

During the charge period, as shown in FIG. 1A, the transistors Q1 and Q4 are on. This allows a charge current IC to flow from a power supply VBB on the high-potential side to a power supply VSS (GND) on the low-potential side via the transistor Q1, the motor 100 (motor coil), and the transistor Q4. By contrast, during the decay period, as shown in FIG. 1B, the transistors Q2 and Q3 are on. This allows a decay current ID to flow from the power supply VSS to the power supply VBB via the transistor Q2, the motor 100, and the transistor Q3. Both the charge current IC and the decay current ID flow through the motor 100 from its positive-side terminal to its negative-side terminal.

Figure 2:
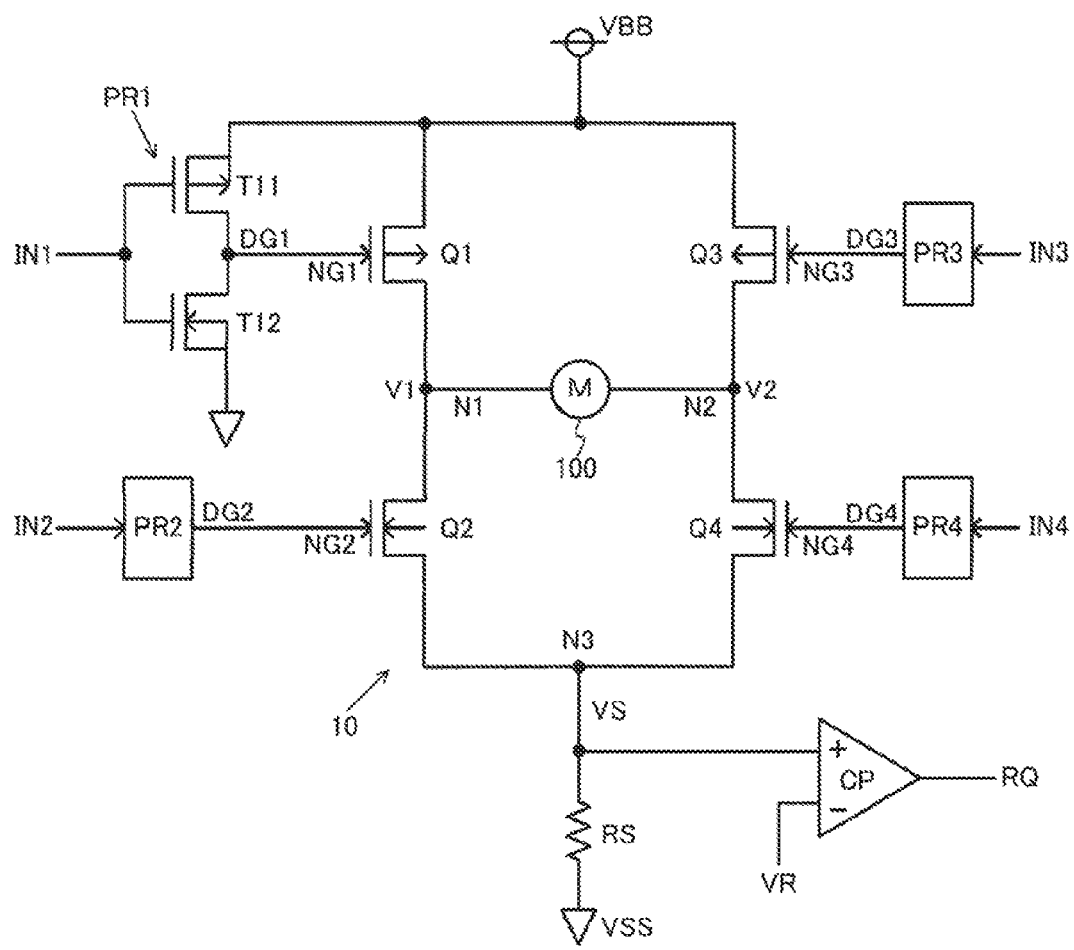
FIG. 2 is an explanatory diagram of a control technique of chopping operation using a sense resistor.
Figure 3:
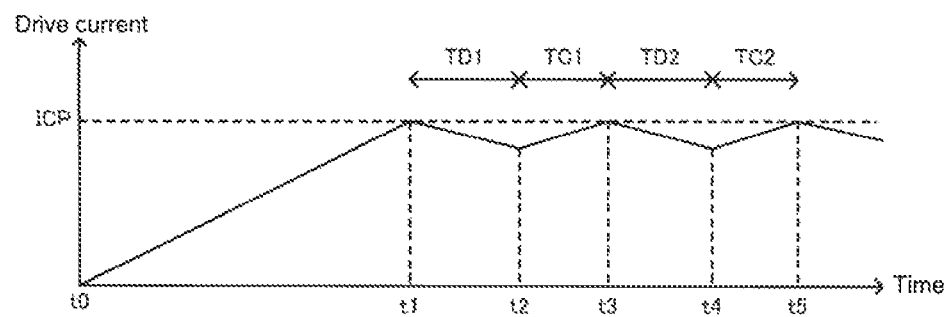
FIG. 3 is another explanatory diagram of the control technique of chopping operation using a sense resistor.

As shown in FIG. 2, a sense resistor RS is provided between a node N3 to which the sources of the transistors Q2 and Q4 are connected and the power supply VSS, and a comparison circuit (comparator) CP compares a voltage VS at the node N3 with a reference voltage VR. Then, as shown in FIG. 3, chopping operation of keeping a chopping current ICP flowing to the bridge circuit 10 constant is controlled. More specifically, the pulse width of a PWM signal is controlled so that the chopping current ICP be kept constant, and control signals for on/off of the transistors Q1 to Q4 are generated based on the PWM signal.

For example, when driving of the motor 100 is started at timing t0 in FIG. 3, the charge period shown in FIG. 1A starts, turning on the transistors Q1 and Q4 and turning off the transistors Q2 and Q3. This allows a drive current (charge current IC) to flow from the power supply VBB to the power supply VSS via the transistor Q1, the motor 100, and the transistor Q4. At timing t1, at which the drive current for the motor 100 reaches the chopping current ICP, the period is switched to a decay period TD1. More specifically, when the drive current becomes so large that the voltage VS at the node N3 exceeds the reference voltage VR, the output of the comparison circuit. CP goes high from low, switching the period to the decay period TD1 at timing t1. The drive current for the motor 100 at the timing t1 is the chopping current ICP. The chopping current ICE is thus detected by detection of the voltage VS.

When the period is switched to the decay period TD1, the transistors Q2 and Q3 are turned on and the transistors Q1 and Q4 are turned off as shown in FIG. 1B. This allows a drive current (decay current ID) to flow from the power supply VSS to the power supply VBB via the transistor Q2, the motor 100, and the transistor Q3. During the decay period TD1, the drive current for the motor 100 decreases with time as shown in FIG. 3.

A circuit device (control circuit) then detects that a predetermined period of time has elapsed from the start of the decay period TD1 with a timer (counter circuit), for example, and switches the period from the decay period TD1 to a charge period TC1. In the charge period TC1, the drive current for the motor 100 increases, and once the drive current reaches the chopping current ICP, the period is changed to a decay period TD2. Then, by repeating this operation, the chopping current ICP as the peak current of the drive current is controlled to be constant, and thus the rotational speed of the motor 100 is kept constant.

Assume that the voltage at a node N1 to which the drains of the transistors Q1 and Q2 and the positive-side terminal of the motor 100 are connected is V1, and that the voltage at a node N2 to which the drains of the transistors Q3 and Q4 and the negative-side terminal of the motor 100 are connected is V2. Assume also that the on resistances of the transistors Q1, Q2, Q3, and Q4 are respectively RON1, RON2, RON3, and RON4, that the voltage of the high-potential side power supply is VBB, and that the voltage of the low-potential side power supply is VSS=0V.

In the charge period in FIG. 1A when the charge current IC flows, the voltages V1 and V2 are respectively represented by equations (1) and (2) below.

$$V1 = VBB - IC \times RON1 \quad (1)$$

$$V2 = IC \times PON4 \quad (2)$$

In the decay period in FIG. 18B when the decay current ID flows, the voltages V1 and V2 are respectively represented by equations (3) and (4) below.

$$V1 = -ID \times RON2 \quad (3)$$

$$V2 = VBB + ID \times RON3 \quad (4)$$

Note that, since the sizes of the transistors Q1 to Q4 are very large in order to increase the capability of driving the motor 100, the on resistances of these transistors are very small. Therefore, the V1 during the charge period in equation (1) above is a value close to VBB (e.g., around 42V), and the V1 during the decay period in equation (3) above is a value close to VSS (e.g., around 0V). Accordingly, at the switching from the charge period to the decay period, an abrupt voltage change (e.g., a voltage change from around 42V to around 0V) occurs at the node N1 of the positive-side terminal of the motor 100.

Figure 4:
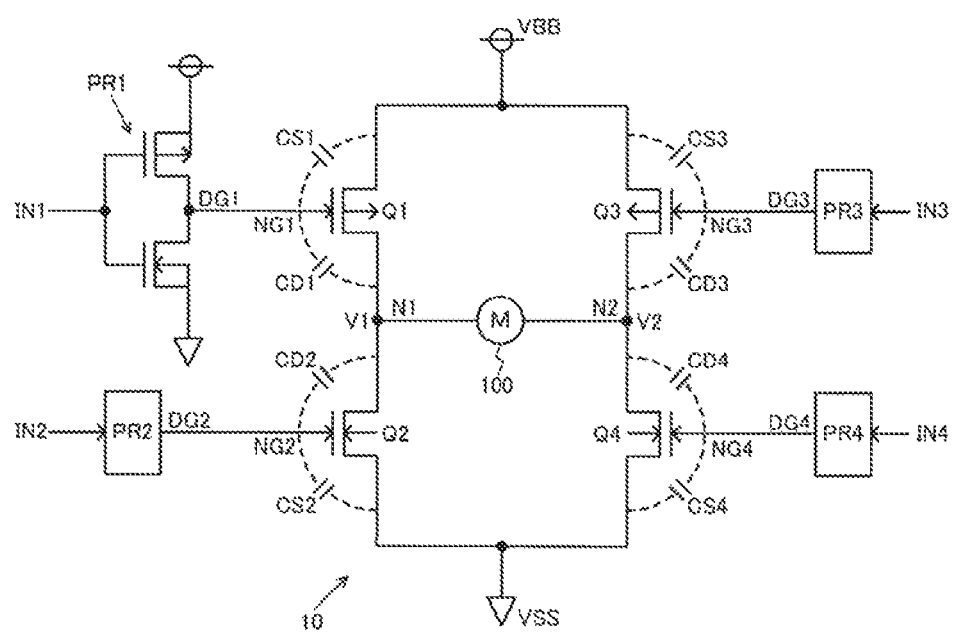
FIG. 4 is an explanatory diagram on the gate capacitance of a transistor constituting the bridge circuit.

On the other hand, as shown in FIG. 4, the transistors Q1 to Q4 have respective gate capacitances. Taking the transistor Q1 as an example, gate capacitances CD1 and CS1 are respectively present between the gate and the drain and between the gate and the source. Since the size of the transistor Q1, etc. is large as described above, CD1, etc. are large parasitic capacitances.

Therefore, when an abrupt voltage change occurs in the voltage V1 at the node N1 as described above, this abrupt voltage change will be conveyed to the gate node NG1 of the transistor Q1 via the gate-drain capacitance CD1, causing a change in the voltage at the gate node NG1.

For example, during the decay period, the voltage at the gate node NG1 is in its high level in order to turn off the transistor Q1. However, with the voltage change (from around 42V to around 0V) at the node N1 being conveyed via the gate-drain capacitance CD1, the voltage at the gate node NG1 is pulled toward the low-level side. As a result, the phenomenon of self-turn-on where the transistor Q1 that should be off is momentarily turned on occurs. Once such self-turn-on occurs, both the transistors Q1 and Q2 are on, causing an abnormal condition where a through current flows from the power supply VBB to the power supply VSS via the transistors Q1 and Q2.

Likewise, at the switching from the decay period to the charge period, an abrupt voltage change (e.g., from around 0V to around 42V) occurs at the node N1. During the charge period, the voltage at the gate node NG2 is in its low level in order to turn off the transistor Q2. However, with the voltage change at the node N1 being conveyed via the gate-drain capacitance CD2, the voltage at the gate node NG2 is pulled toward the high-level side. As a result, the phenomenon of self-turn-on occurs in the transistor Q2, causing an abnormal condition where a through current, etc. flows to the transistors Q1 and Q2. A similar abnormal condition may also occur in the transistors Q3 and Q4. Occurrence of such an abnormal condition causes problems such as degrading the reliability and increasing the consumption current.

Figure 5:
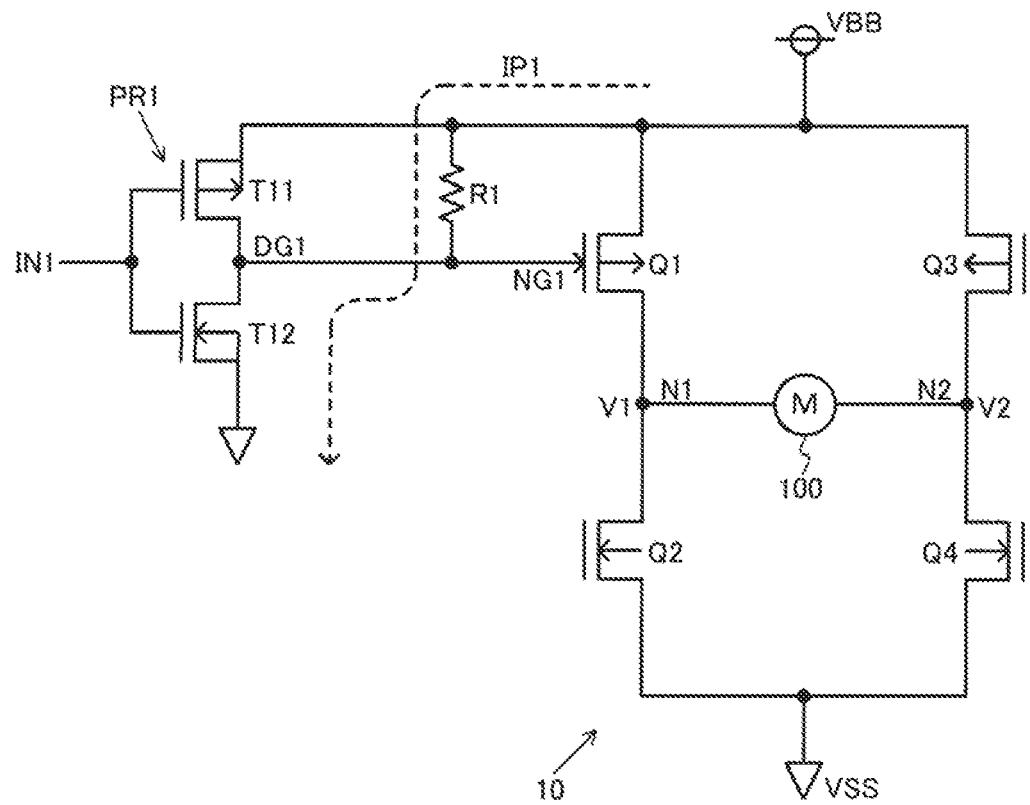
FIG. 5 shows an example configuration of a circuit device of a comparative example of an embodiment of the invention.

FIG. 5 shows an example of a circuit device that is to be a comparative example of this embodiment. In the circuit device of the comparative example, a resistor R1 is provided between the power supply VBB and the gate node NG1 of the transistor Q1 in order to prevent occurrence of an abnormal condition as described above. With provision of the resistance R1, even if an abrupt voltage change occurs at the node N1, the gate node NG1 of the transistor Q1 is pulled up with the resistor R1, and thus occurrence of self-turn-on of the transistor Q1 can be prevented or reduced.

Having such a resistor R1, however, when an input signal IN1 of the pre-driver PR1 is in its high level turning on an N-type transistor T12 constituting the pre-driver PR1, a current IP1 as shown in FIG. 5 will flow via the resistor R1 and the transistor T12. Such a flowing current IP1 is a consumption current that is simply lost continuously, and thus increases the power consumption of the circuit device.

Figure 6A:
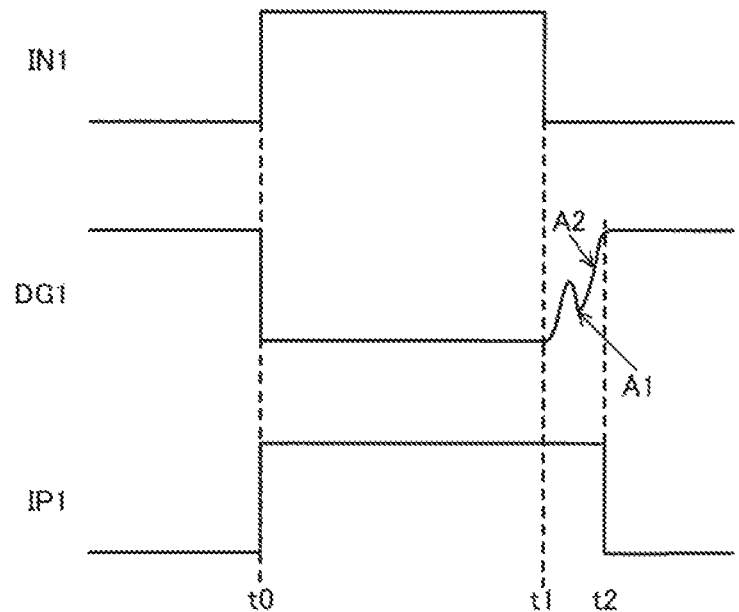
FIGS. 6A and 6B are explanatory diagrams of a problem of the circuit device of the comparative example.
Figure 6B:
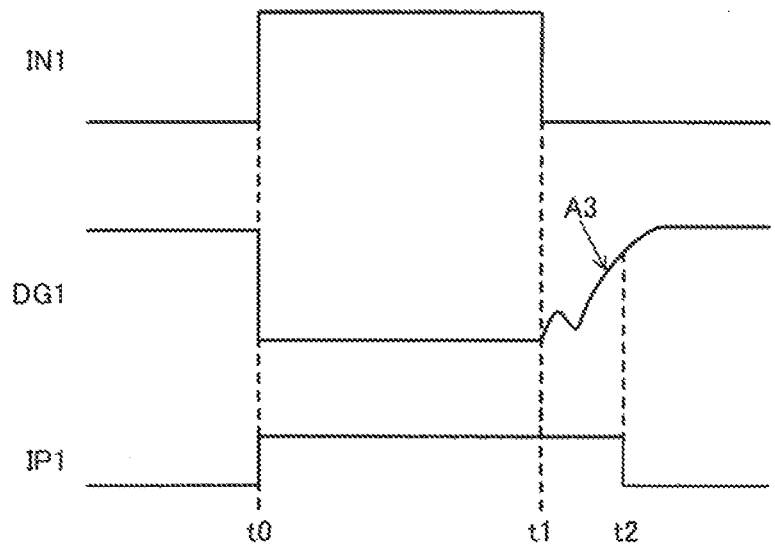

For example, FIGS. 6A and 6B show examples of waveforms of the input signal IN1, the drive signal DG1, and the current IP1 in the circuit device in FIG. 5.

While the voltage of the drive signal DG1 is pulled toward the low-level side as shown by A1 in FIG. 6A due to an abrupt voltage change at the node N1, it is pulled back toward the high-level side by the pull-up by the resistor R1 as shown by A2, preventing or reducing self-turn-on of the transistor Q1.

At this time, when the resistance value of the resistor R1 is small as shown in FIG. 6A, the current IP1 is large, largely increasing the power consumption. By contrast, when the resistance value of the resistor R1 is increased as shown in FIG. 6B, the current IP1 decreases, and thus the increase in power consumption can be reduced to some extent. However, it takes time until the voltage of the drive signal DG1 returns to the high level as shown by A3, causing problems that the timing of the on/off control of the transistor Q1, etc. becomes off and that a through current flows.

2. Configuration of Circuit Device

Figure 7:
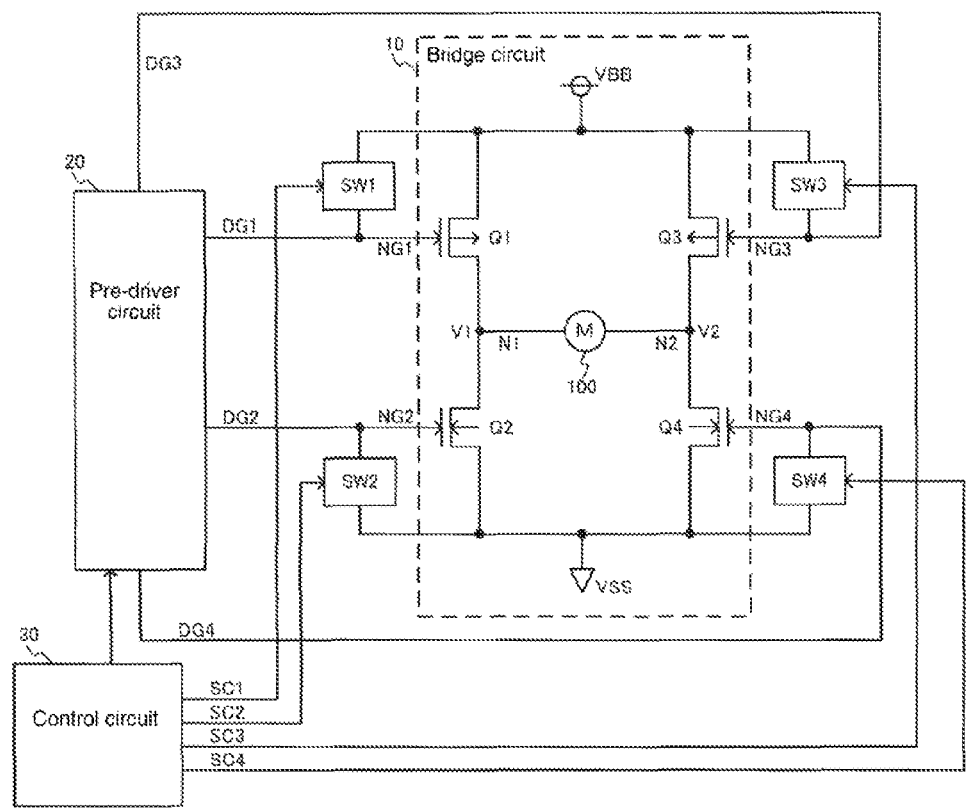
FIG. 7 shows an example configuration of a circuit device of the embodiment.

FIG. 7 shows an example configuration of a circuit device of this embodiment that can solve the problem as described above. The circuit device (motor driver) includes a bridge circuit 10, a pre-driver circuit 20, a control circuit 30, and first to fourth switch circuits SW1 to SW4.

Note that the configuration of the circuit device of this embodiment is not limited to that in FIG. 7, but various modifications such as omission of part of the components and addition of a new component can be made. For example, the sense resistor RS and the comparison circuit CP described with reference to FIG. 2 can be provided when the chopping control is involved. In this case, the sense resistor RS can be provided as an external component to the circuit device, and the comparison circuit CP, a circuit for generating the reference voltage VR, etc. can be provided as built-in circuits of the circuit device.

Figure 14:
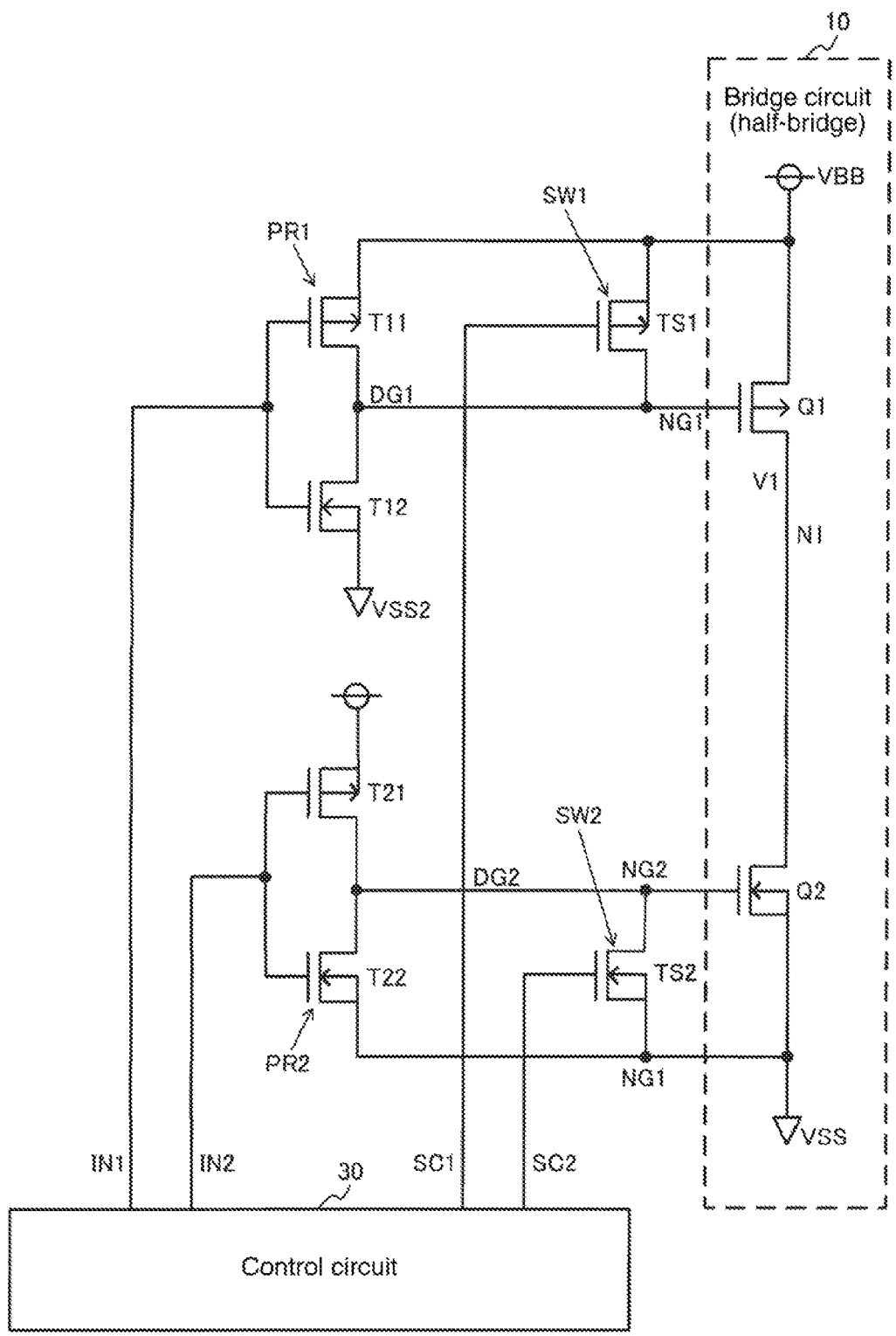
FIG. 14 shows a second modification of the circuit device of the embodiment.

While FIG. 7 shows the case where the bridge circuit 10 is of an H-bridge type, this embodiment is not limited to this, but a half-bridge type as shown in FIG. 14 to be described later may also be used. Note also that, while the embodiment will be described hereinafter taking the case of driving the motor 100 as an example, the object to be driven by the circuit device of this embodiment is not limited to the motor 100, but can be any of various elements and devices having an inductor (coil).

The bridge circuit 10 includes first to fourth transistors Q1, Q2, Q3, and Q4. The first transistor Q1 is a P-type transistor provided between the node of a high-potential side power supply VBB and a first node N1. The second transistor Q2 is an N-type transistor provided between the first node N1 and the node of a low-potential side power supply VSS. The third transistor Q3 is a P-type transistor provided between the node of the power supply VBB and a second node N2. The fourth transistor Q4 is an N-type transistor provided between the second node N2 and the node of the power supply VSS. The first node N1 is a node connected to the positive-side terminal (first terminal in a broad sense) of the motor 100 (inductor in a broad sense), and the second node N2 is a node connected to the negative-side terminal (second terminal in a broad sense) of the motor 100.

The pre-driver circuit 20 is a circuit that drives the bridge circuit 10. More specifically, the pre-driver circuit 20 outputs a first drive signal DG1 and a second drive signal DG2 to a first gate node NG1 of the first transistor Q1 and a second gate node NG2 of the second transistor Q1, respectively. The pre-driver circuit 20 also outputs a third drive signal DG3 and a fourth drive signal DG4 to a third gate node NG3 of the third transistor Q3 and a fourth gate node NG4 of the fourth transistor Q4, respectively.

The first switch circuit SW1 is provided between the node of the high-potential side power supply VBB and the first gate node NG1 of the first transistor Q1. The second switch circuit SW2 is provided between the node of the low-potential side power supply VSS and the second gate node NG2 of the second transistor Q2. The third switch circuit SW3 is provided between the node of the power supply VBB and the third gate node NG3 of the third transistor Q3. The fourth switch circuit SW4 is provided between the node of the power supply VSS and the fourth gate node NG4 of the fourth transistor Q4. Alternatively, only the switch circuits SW1 and SW3 on the high side may be provided, omitting provision of the switch circuits SW2 and SW4 on the low side.

The control circuit 30 is a circuit that performs various types of control processing. For example, the control circuit 30 performs on/off control of the switch circuits SW1 to SW4. More specifically, the control circuit 30 outputs on/off control signals SC1 to SC4 to the switch circuits SW1 to SW4 to perform on/off control of the switch circuits. Also, the control circuit 30 outputs on/off control signals to the pre-driver circuit 20 to perform on/off control of the transistors Q1 to Q4. In the case of performing the chopping control as in FIG. 2, for example, the control circuit 30 controls the pulse width of the PWM signal so that the chopping current ICP flowing to the bridge circuit 10 be kept constant in response to the comparison result signal from the comparison circuit CP and a signal from the timer. Based on the resultant. PWM signal, the control circuit 30 generates the on/off control signals for the transistors Q1 to Q4, and outputs the control signals to the pre-driver circuit 20. Receiving these control signals, the pre-driver circuit 20 outputs the drive signals DG1 to DG4 to the transistors Q1 to Q4.

In this embodiment, the control circuit 30 keeps the switch circuit SW1 off during the period when the pre-driver circuit 20 is outputting the low level (voltage level of logic "0") of the drive signal DG1 to the gate node NG1. In other words, the switch circuit SW1 is kept off during the period when the drive signal DG1 is in the low level and thus the P-type transistor Q1 is on.

By doing so, it is possible to prevent or reduce occurrence of such a situation as that in the comparative example in FIG. 5 where the current IP1 continues to flow consuming power wastefully. Also, while the technique of using the resistor R1 as in the comparative example in FIG. 5 has a problem that, with the layout area of the resistor R1 being large, the layout area of the chip of the circuit device is also large, the technique of using the switch circuit SW1 constituted by a transistor, etc. of this embodiment can reduce the layout area of the circuit device.

The control circuit 30 turns on, from off, the switch circuit SW1 when the pre-driver circuit 20 has changed the drive signal DG1 from the low level to the high level (voltage level of logic "1"). For example, the switch circuit SW1 is turned on from off after the drive signal DG1 has changed from the low level to the high level.

By doing so, with the switch circuit SW1, the gate node NG1 is set to the high level that is the voltage level of the power supply VBB. Therefore, even when an abrupt voltage change occurs at the node N1 at the switching from the charge period (first period in a broad sense) to the decay period (second period in a broad sense), occurrence of self-turn-on caused by the voltage change can be prevented or reduced. That is, since the voltage at the gate node NG1 is set to the high level with the turned-on switch circuit SW1, it is possible to prevent or reduce occurrence of a situation where an abrupt voltage change at the node N1 is conveyed to the gate node NG1 via the gate-drain capacitance CD of the transistor Q1. Thus, the problem of self-turn-on can be solved.

In relation to the above, the control circuit 30 turns on, from off, the switch circuit SW1 at a given time after the timing at which the pre-driver circuit 20 has changed the drive signal DG1 from the low level to the high level. That is, the switch circuit SW1 is turned on from off after a lapse of a given period of time. Also, the control circuit 30 turns off, from on, the switch circuit SW1 at a given time before the timing at which the pre-driver circuit 20 changes the drive signal DG1 from the high level to the low level. By doing so, it is possible to effectively prevent or reduce such a situation that the on period of an N-type transistor (T12 in FIG. 8) of the pre-driver circuit 20 that drives the transistor Q1 may coincide with the on period of the switch circuit SW1, causing flow of a through current from the power supply VBB to the power supply VSS via the switch circuit SW1 and the N-type transistor.

Likewise, the control circuit 30 keeps the switch circuit SW2 off during the period when the pre-driver circuit 20 is outputting the high level of the drive signal DG2 to the gate node NG2 of the transistor Q2. In other words, the switch circuit SW2 is kept off during the period when the drive signal DG2 is in the high level and thus the N-type transistor Q2 is on. By doing so, it is possible to prevent occurrence of a wasteful consumption current that is the problem with the comparative example in FIG. 5.

The control circuit 30 turns on, from off, the switch circuit SW2 when the pre-driver circuit 20 changes the drive signal DG2 from the high level to the low level. By doing so, with the switch circuit SW2, the gate node NG2 is set to a low-level voltage. Therefore, even when an abrupt voltage change occurs at the node N1 at the switching from the decay period (second period) to the charge period (first period), occurrence of self-turn-on caused by the voltage change can be prevented or reduced.

In relation to the above, the control circuit 30 turns on, from off, the switch circuit SW2 at a given time after the timing at which the pre-driver circuit 20 has changed the drive signal DG2 from the high level to the low level. Also, the control circuit 30 turns off, from on, the switch circuit SW2 at a given time before the timing at which the pre-driver circuit 20 changes the drive signal DG2 from the low level to the high level. By doing so, it is possible to effectively prevent or reduce such a situation that the on period of a P-type transistor (T21 in FIG. 8) of the pre-driver circuit 20 that drives the transistor Q2 may coincide with the on period of the switch circuit SW2, causing flow of a through current.

The control circuit 30 performs switch control processing similar to that described above also for the switch circuits SW3 and SW4. More specifically, the control circuit 30 keeps the switch circuit SW3 off during the period when the pre-driver circuit 20 is outputting the low level of the drive signal DG3 to the gate node NG3 of the transistor Q3, and turns on, from off, the switch circuit SW3 when the pre-driver circuit 20 changes the drive signal DG3 from the low level to the high level. Similarly, the control circuit 30 keeps the switch circuit SW4 off during the period when the pre-driver circuit 20 is outputting the high level of the drive signal DG4 to the gate node NG4 of the transistor Q4, and turns on, from off, the switch circuit SW4 when the pre-driver circuit 20 changes the drive signal DG4 from the high level to the low level. By doing so, it is possible to achieve both solving the problem of self-turn-on and reduction in power consumption.

3. Detailed Configuration and Operation of Circuit Device and Control Circuit

Figure 8:
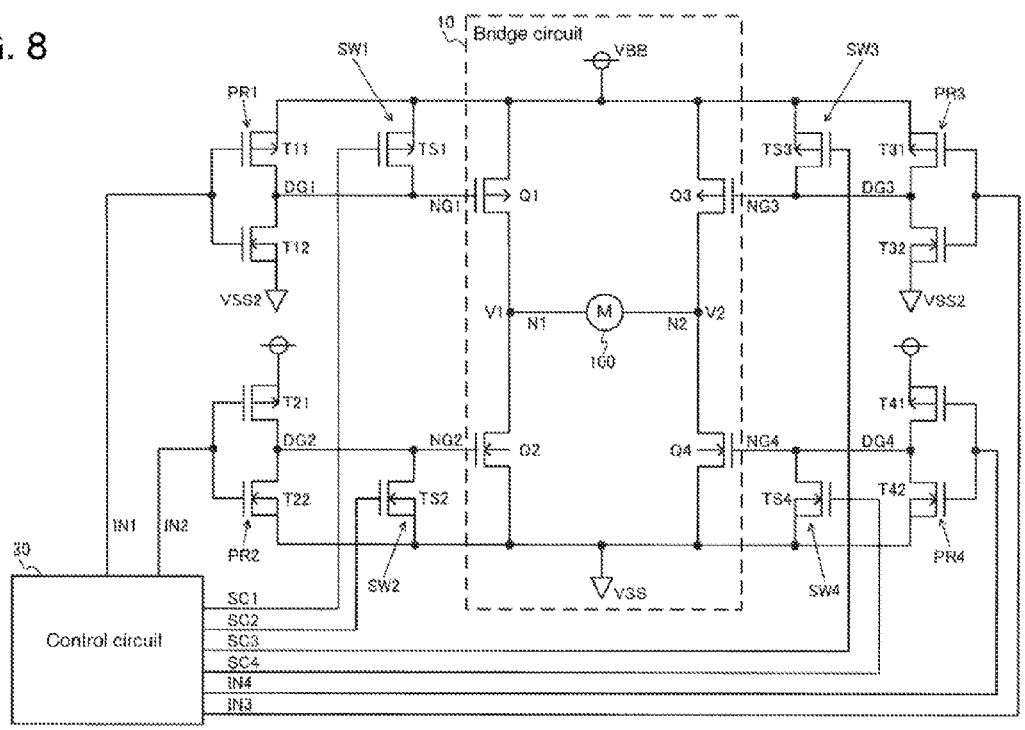
FIG. 8 shows a detailed example configuration of the circuit device of the embodiment.

FIG. 8 shows a detailed example configuration of the circuit device of this embodiment. In FIG. 8, the pre-driver circuit 20 in FIG. 7 is constituted by first to fourth pre-drivers PR1 to PR4. Each of the pre-drivers PR1 to PR4 is constituted by an inverter circuit made of a P-type transistor and an N-type transistor. For example, the first pre-driver PR1 is constituted by a P-type transistor T11 and an N-type transistor T12, and the second pre-driver PR2 is constituted by a P-type transistor T21 and an N-type transistor T22. This also applies to the third and fourth pre-drivers PR3 and PR4. On/off control signals from the control circuit 30 are input into the first to fourth pre-drivers PR1 to PR4 as input signals IN1 to IN4.

In FIG. 8, also, the switch circuits SW1 to SW4 in FIG. 7 are respectively constituted by transistors TS1 to TS4. For example, the switch circuit SW1, provided between the node of the power supply VBB and the gate node NG1, is constituted by the P-type transistor TS1 that receives at its gate the control signal SC1 from the control, circuit 30. The switch circuit SW2, provided between the gate node NG2 and the node of the power supply VSS, is constituted by the N-type transistor TS2 that receives at its gate the control signal. SC2 from the control circuit 30. This also applies to the switch circuits SW3 and SW4 respectively constituted by the transistors TS3 and TS4.

Figure 9:
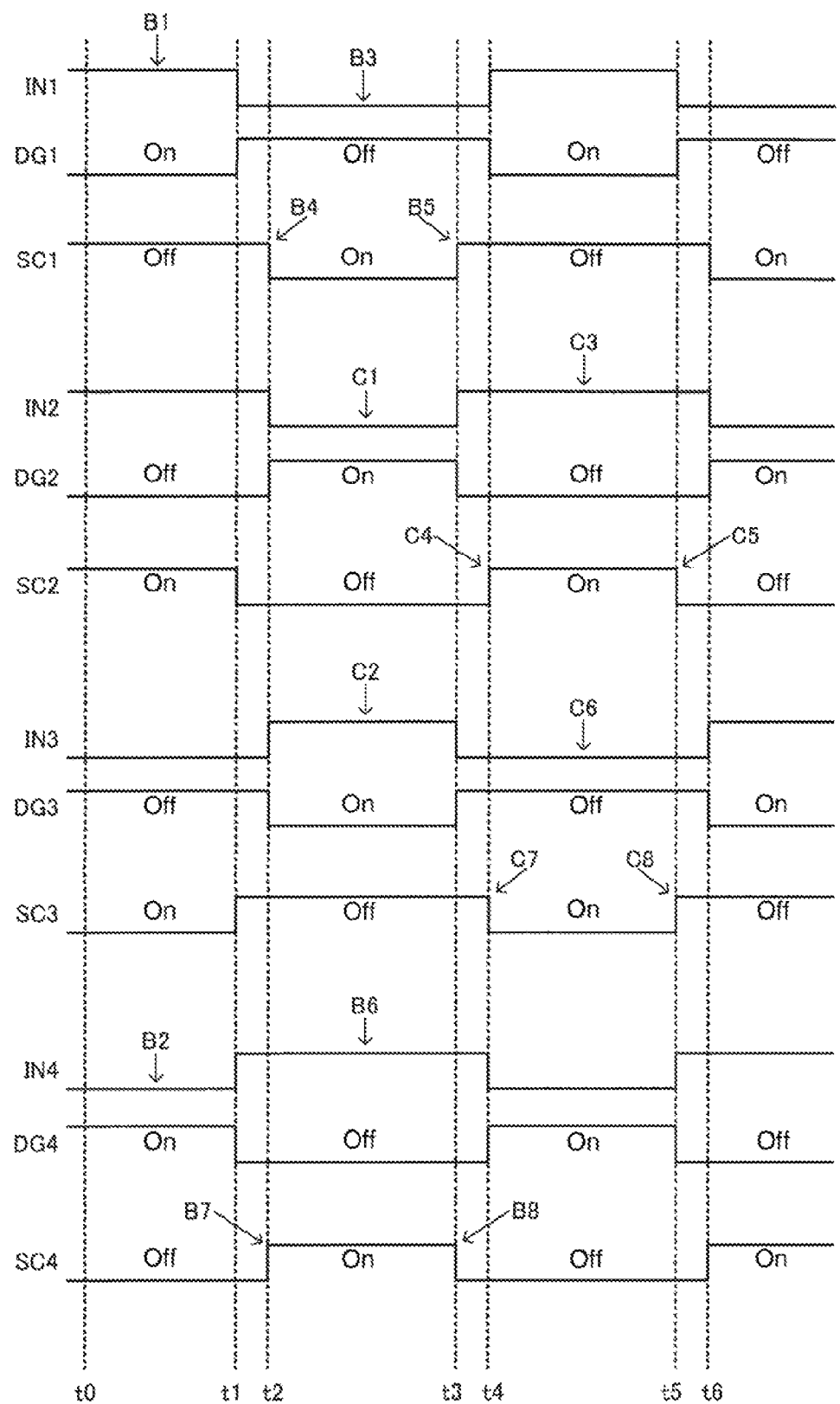
FIG. 9 shows an example of signal waveforms for explaining the operation of the circuit device of the embodiment.

FIG. 9 shows an example of signal waveforms for explaining the operation of the circuit device of this embodiment. First, the operation of the transistors Q1 and Q4 will be described.

As shown by B1 in FIG. 9, for example, during the charge period (FIG. 1A), since the input signal IN1 from the control circuit 30 is high and thus the drive signal DG from the pre-driver PR1 is low (VSS2), the P-type transistor Q1 of the bridge circuit 10 is on. During this time, since the control signal SC1 from the control circuit 30 is high, the P-type transistor TS1 of the switch circuit SW1 is off. Accordingly, occurrence of a wasteful consumption current as in the comparative example in FIG. 5 is prevented or reduced.

Likewise, as shown by B2 in FIG. 9, during the charge period, since the input signal. IN4 is low and thus the drive signal DG4 from the pre-driver PR4 is high, the N-type transistor Q4 of the bridge circuit 10 is on. During this time, since the control signal SC4 is low, the N-type transistor TS4 of the switch circuit SW4 is off. Accordingly, occurrence of a wasteful consumption current is prevented or reduced.

Thereafter, at timing t1, when the period is switched from the charge period to the decay period (FIG. 1B), since the input signal IN1 goes low and thus the drive signal DG1 goes high, as shown by B3, the P-type transistor Q1 of the bridge circuit 10 is turned off. At this time, since the control signal SC1 goes low, the P-type transistor TS1 of the switch circuit SW1 is turned on. By this, the gate node NG1 is set to the high level that is the voltage level of the power supply VBB, and thus occurrence of self-turn-on of the transistor Q1 caused by an abrupt voltage change at the node N1 is prevented or reduced.

In relation to the above, as shown by B4, at timing t2 at which a given period of time has elapsed from the timing t1 at which the drive signal DG1 has changed from the low level to the high level, the control signal SC1 changes from the high level to the low level, turning on the transistor TS1 of the switch circuit SW1. Also, as shown by B5, at timing t3 preceding, by a given period of time, timing t4 at which the drive signal DG1 changes from the high level to the low level, the control signal SC1 changes from the low level to the high level, turning off the transistor TS1 of the switch circuit SW1. In this way, it is possible to prevent or reduce such a situation that the on period of the transistor TS1 of the switch circuit SW may coincide with the on period of the N-type transistor T12 of the pre-driver PR1 causing flow of a through current.

Likewise, when the period is switched to the decay period, since the input signal IN4 goes high and thus the drive signal DG4 goes low, as shown by B6, the N-type transistor Q4 of the bridge circuit 10 is turned off. At this time, since the control signal SC4 goes high, the N-type transistor TS4 of the switch circuit SW4 is turned on. By this, the gate node NG4 is set to the low level that is the voltage level of the power supply VSS, and thus occurrence of self-turn-on of the transistor Q4 caused by an abrupt voltage change at the node N2 is prevented or reduced.

In relation to the above, as shown by B7, at the timing t2 at which a given period of time has elapsed from the timing t1 at which the drive signal DG4 has changed from the high level to the low level, the control signal SC4 changes from the low level to the high level, turning on the transistor TS4 of the switch circuit SW4. Also, as shown by B8, at the timing t3 preceding, by a given period of time, the timing t4 at which the drive signal DG4 changes from the low level to the high level, the control signal SC4 changes from the high level to the low level, turning off the transistor TS4 of the switch circuit SW4. In this way, it is possible to prevent or reduce such a situation that the on period of the transistor TS4 of the switch circuit SW4 may coincide with the on period of a P-type transistor T41 of the pre-driver PR4 causing flow of a through current.

Next, the operation of the transistors Q2 and Q3 will be described. As shown by C1 in FIG. 9, during the decay period, since the input signal IN2 is low and thus the drive signal DG2 from the pre-driver PR2 is high, the N-type transistor Q2 of the bridge circuit 10 is on. During this time, since the control signal SC2 is low, the N-type transistor TS2 of the switch circuit SW2 is off. Accordingly, occurrence of a wasteful consumption current is prevented or reduced.

Likewise, as shown by C2, during the decay period, since the input signal IN3 is high and thus the drive signal DG3 from the pre-driver PR3 is low, the P-type transistor Q3 of the bridge circuit 10 is on. During this time, since the control signal SC3 is high, the P-type transistor TS3 of the switch circuit SW3 is off. Accordingly, occurrence of a wasteful consumption current is prevented or reduced.

Thereafter, at the timing t3, when the period is switched from the decay period to the charge period, since the input signal IN2 goes high and thus the drive signal DG2 goes low, as shown by C3, the N-type transistor Q2 of the bridge circuit 10 is turned off. At this time, since the control signal SC2 goes high, the N-type transistor TS2 of the switch circuit SW2 is turned on. By this, the gate node NG2 is set to the low level, and thus occurrence of self-turn-on of the transistor Q2 caused by an abrupt voltage change at the node N1 is prevented or reduced.

In relation to the above, as shown by C4, at the timing t4 at which a given period of time has elapsed from the timing t3 at which the drive signal DG2 has changed from the high level to the low level, the control signal SC2 changes from the low level to the high level, turning on the transistor TS2 of the switch circuit SW2. Also, as shown by C5, at the timing t5 preceding, by a given period of time, the timing t6 at which the drive signal DG2 changes from the low level to the high level, the control signal SC2 changes from the high level to the low level, turning off the transistor TS2 of the switch circuit SW2. In this way, it is possible to prevent or reduce such a situation that the on period of the transistor TS2 of the switch circuit SW2 may coincide with the on period of the P-type transistor T21 of the pre-driver PR2 causing flow of a through current.

Likewise, when the period is switched to the charge period, since the input signal IN3 goes low and thus the drive signal DG3 goes high, as shown by C6, the P-type transistor Q3 of the bridge circuit 10 is turned off. At this time, since the control signal SC3 goes low, the P-type transistor TS3 of the switch circuit SW3 is turned on. By this, the gate node NG3 is set to the high level, and thus occurrence of self-turn-on of the transistor Q3 caused by an abrupt voltage change at the node N2 is prevented or reduced.

In relation to the above, as shown by C7, at the timing t4 at which a given period of time has elapsed from the timing t3 at which the drive signal DG3 has changed from the low level to the high level, the control signal SC3 changes from the high level to the low level, turning on the transistor TS3 of the switch circuit SW3. Also, as shown by C8, at the timing t5 preceding, by a given period of time, the timing t6 at which the drive signal DG3 changes from the high level to the low level, the control signal SC3 changes from the low level to the high level, turning off the transistor TS3 of the switch circuit SW3. In this way, it is possible to prevent or reduce such a situation that the on period of the transistor TS3 of the switch circuit SW3 may coincide with the on period of a transistor T32 of the pre-driver PR3 causing flow of a through current.

As described above, by the switch control technique of this embodiment, it is possible to prevent or reduce occurrence of self-turn-on caused by an abrupt voltage change at the node N1 or N2 and also effectively prevent or reduce occurrence of a wasteful consumption current and occurrence of a through current in the pre-driver.

Figure 10A:
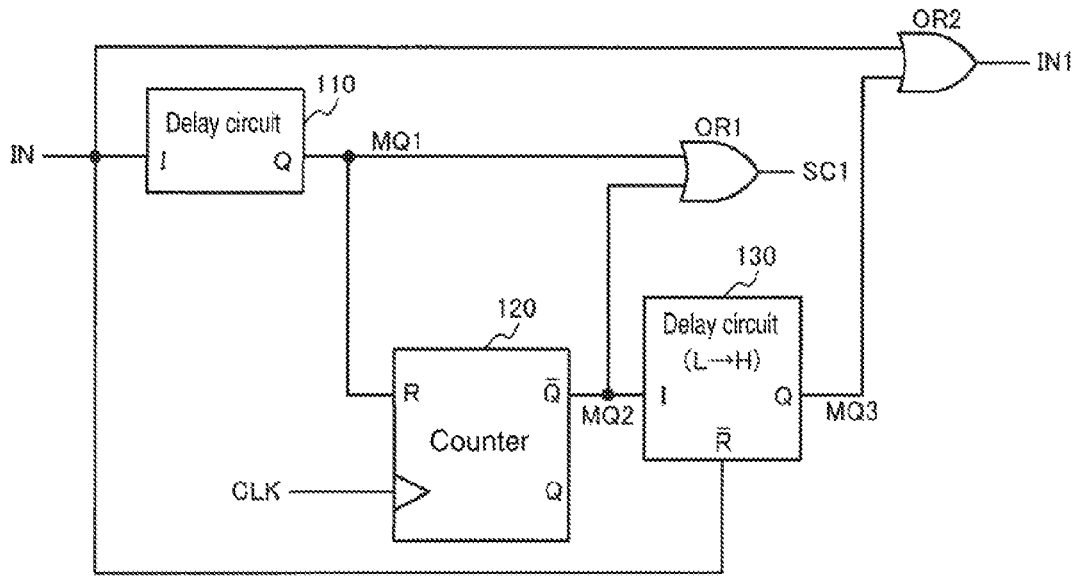
FIGS. 10A and 10B are explanatory diagrams of the configuration and operation of a control circuit.
Figure 10B:
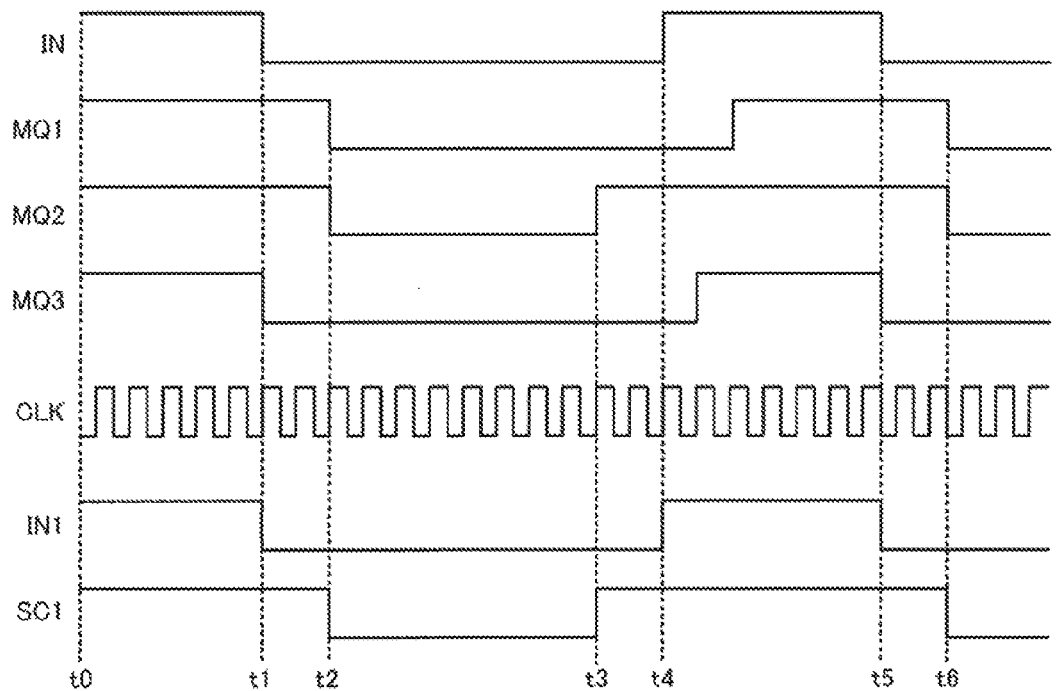

FIGS. 10A and 10B are diagrams for explaining detailed configuration and operation of the control, circuit 30. FIG. 10A shows the configuration of a circuit, in the control circuit 30, that generates the input signal IN1 to the pre-driver PR1. Note that circuits that generate the input signals IN2 to IN4 to the other pre-drivers PR2 to PR4 have similar configurations.

A signal IN is input into a delay circuit 110, and a delayed signal MQ1 is input into the reset terminal of a counter 120. The signal MQ1 and an output signal MQ2 of the counter 120 are then input into an OR circuit OR1, to generate the control signal SC1 as shown in FIG. 10B. The output signal MQ2 of the counter 120 is also input into a delay circuit 130 that also receives the signal IN at its reset terminal. A delayed signal MQ3 from the delay circuit 130 and the signal IN are input into an OR circuit OR2, to generate the input signal IN1 to the pre-driver PR1 as shown in FIG. 10B. In this way, the signals in FIG. 9 can be generated.

4. Level Shifter

Figure 11:
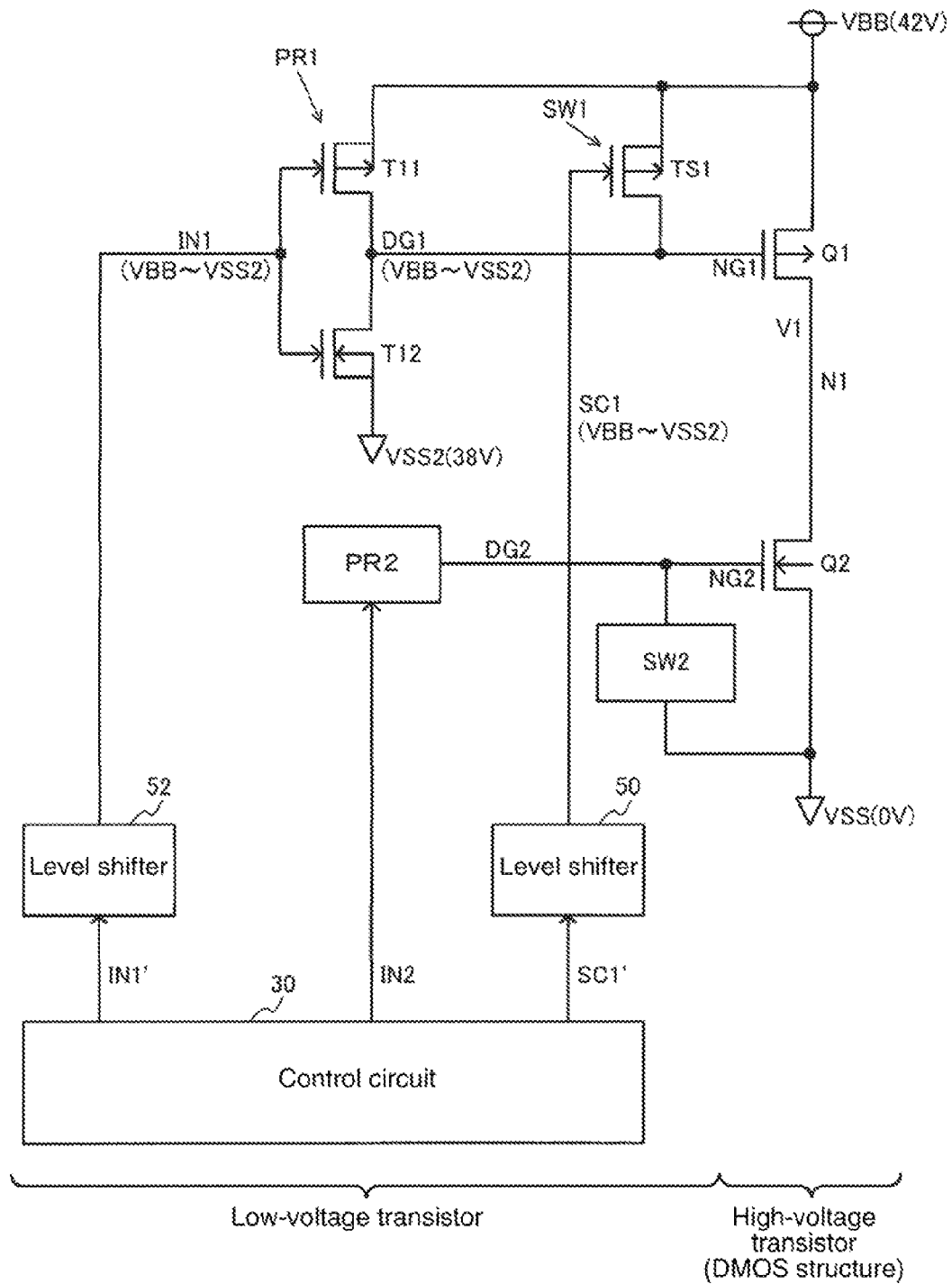
FIG. 11 is an explanatory diagram of a technique of providing a level shifter.

As shown in FIG. 11, in this embodiment, the transistors Q1 and Q2 are high-voltage transistors (e.g., a breakdown voltage of 42V or more). For example, they are transistors having a double-diffused metal oxide semiconductor (DMOS) structure as will be described later. By contrast, the transistors constituting the pre-drivers PR1 and PR2 (pre-driver circuit 20), the switch circuits SW1 and SW2, etc. are low-voltage transistors (e.g., a breakdown voltage of about 6V to 10V). More specifically, in FIGS. 7 and 8, while the transistors Q1 to Q4 are high-voltage transistors having the DMOS structure, the transistors constituting the switch circuits SW1 to SW4, the pre-driver circuit 20, and the control circuit 30 are low-voltage transistors.

As described above, by using high-voltage transistors only for the transistors Q1 to Q4 for driving the motor 100 and using low-voltage transistors for the transistors constituting the other circuits, the layout area of the chip of the circuit device can be reduced. That is, by limiting the use of high-voltage transistors, which increase the layout area, only to the transistors Q1 to Q4, the chip area of the entire circuit device can be reduced. Also, when the transistors Q1 to Q4 have the DMOS structure and also have a sufficient size for achieving low on resistance, the gate-drain capacitance of the transistor becomes large compared with that of the CMOS structure, having the possibility that a self-turn-on failure may easily occur. According to the above-described switch control technique of this embodiment, such a failure can be solved.

In this embodiment, in order to turn on/off each transistor properly, level shifters 50 and 52 as shown in FIG. 11 are provided.

Assume, for example, that, in FIG. 11, the pre-drivers PR1 and PR2 output the drive signals DG1 and DG2 to the gate nodes NG1 and NG2 of the transistors Q1 and Q2, respectively, and that the voltage of the high-potential side power supply is VBB, the voltage of the low-potential side power supply is VSS, and the voltage of a second low-potential side power supply located between the high-potential side power supply and the low-potential side power supply is VSS2. Note that the relationship of VBB>VSS2>VSS is established among the voltages of these power supplies.

In the above case, the pre-driver PR1 outputs the drive signal DG1 having an amplitude range of VBB to VSS2 to the gate node NG1 of the transistor Q1. Specifically, the pre-driver PR1 is an inverter circuit including the P-type transistor T11 the source of which is connected to the power supply VBB and the N-type transistor T12 the source of which is connected to the power supply VSS2, where the transistors T11 and T12 are connected in series, and outputs the drive signal DG1 having an amplitude range of VBB to VSS2. For example, when VBB=42V and VSS2=38V, the pre-driver PR1 outputs the drive signal DG1 having a high level (logic "1") of 42V and a low level (logic "0") of 38V to the transistor Q1. By doing so, the transistor Q1 can be turned on/off properly.

The level shifter 50 level-shifts the amplitude range (voltage range) of the control signal SC1 that turns on/off the switch circuit SW1 to an amplitude range of VBB to VSS2. For example, the amplitude range of a control signal SC1' from the control circuit 30 is VDD to VSS (e.g., 5V to 0V or 3.3V to 0V). The level shifter 50, receiving the control signal SC1', level-shifts the amplitude range and outputs the control signal SC1 having an amplitude range of VBB to VSS2 to the gate of the transistor TS1 of the switch circuit SW1. This makes it possible to use a low-voltage transistor as the transistor TS1 of the switch circuit SW1, for example. More specifically, since the voltage (42V) from the high-voltage side power supply VBB is supplied to the source of the transistor TS1, if the control signal SC1' having a low amplitude range of VDD to VSS is input into the gate of the transistor TS1, there is the possibility that the low-voltage transistor TS1 may be broken. With the level shifter 50 that outputs the control signal SC1 of which the amplitude range has been converted to VBB to VSS2 to the gate of the transistor TS1, occurrence of such a situation can be prevented.

The level shifter 52, receiving an input signal IN1' having an amplitude range of VDD to VSS from the control circuit 30, level-shifts the amplitude range and outputs the input signal IN1 having an amplitude range of VBB to VSS2 to the pre-driver PR1. Note that, while the level shifters 50 and 52 for the pre-driver PR1, the switch circuit SW1, and the transistor Q1 are shown in FIG. 11 as an example, level shifters similar to those in FIG. 11 are to be provided also for the pre-driver PR3, the switch circuit SW3, the transistor Q3, etc. to perform level-shifting of the amplitude range.

5. Modifications

Next, modifications of this embodiment will be described.

Figure 12:
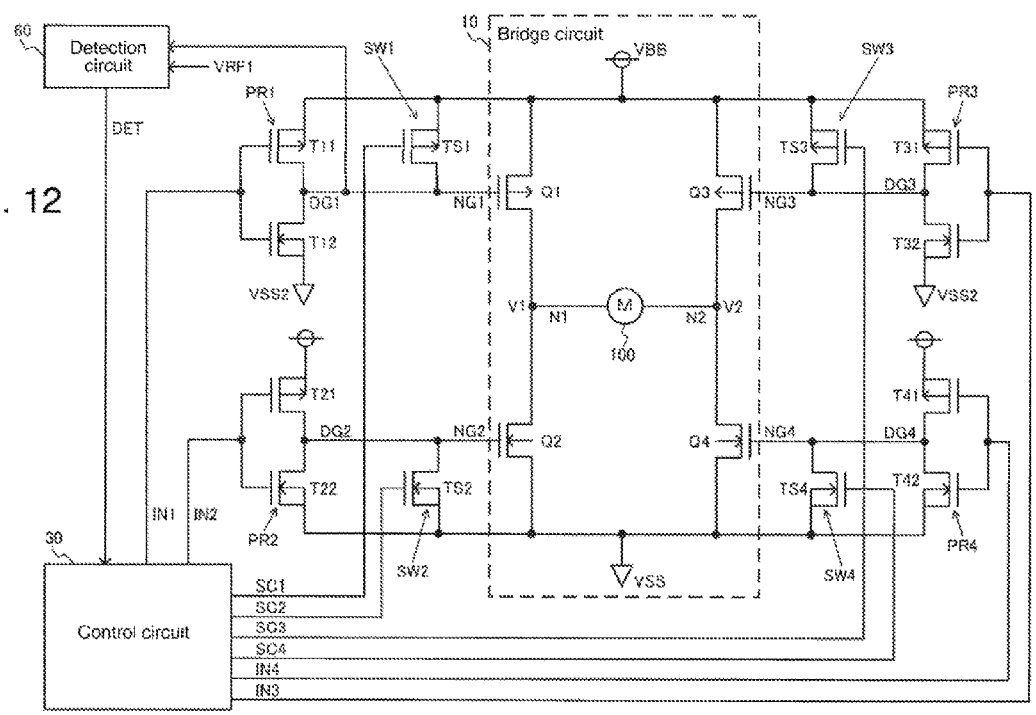
FIG. 12 shows a first modification of the circuit device of the embodiment.

In a first modification in FIG. 12, a detection circuit 60 is further provided in addition to the configuration in FIGS. 7 and 8. The detection circuit 60 (voltage drop detector) detects a change in voltage level at the gate node NG1 of the transistor Q1. For example, the detection circuit 60 detects whether or not the voltage level at the gate node NG1 has fallen below a reference voltage VRF1. The control circuit 30 then generates the control signal SC1 that turns on/off the switch circuit SW1 based on the detection result from the detection circuit 60. That is, the control circuit 30 generates the control signal SC1 based on a detection signal DET from the detection circuit 60 and outputs the signal to the switch circuit SW1.

Figure 13:
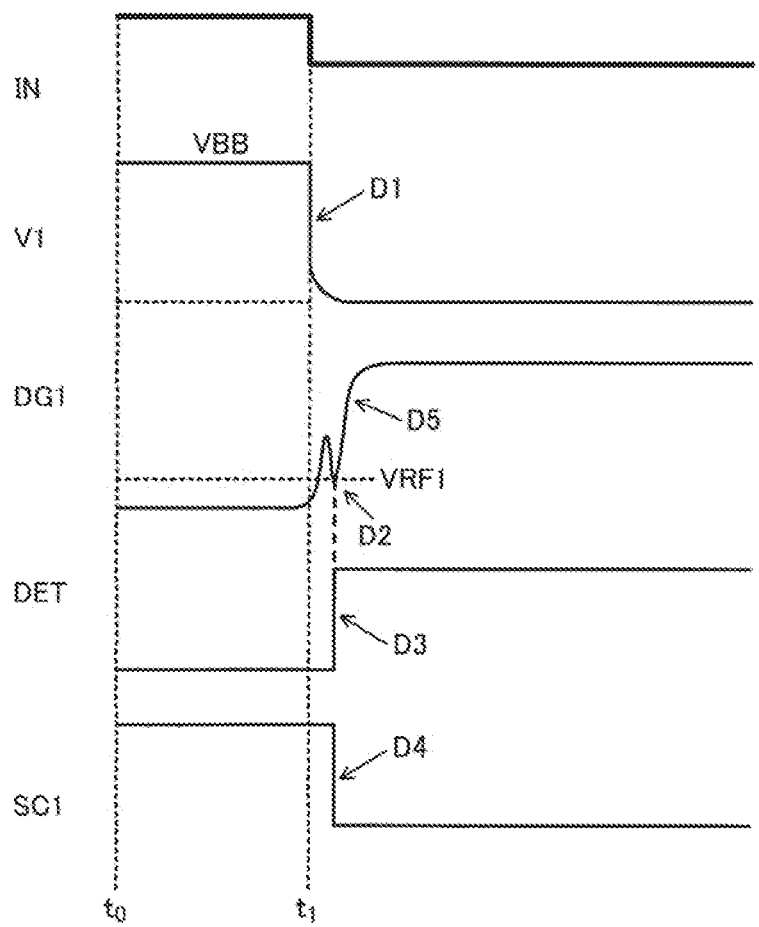
FIG. 13 is an explanatory diagram of the operation of the first modification.

FIG. 13 shows an example of signal waveforms for explaining the operation of the first modification in FIG. 12. When the input signal IN1 changes from the high level to the low level at timing t1, switching the period from the charge period to the decay period, for example, the voltage at the node N1 abruptly changes from around VBB to around 0V as shown by D1. The voltage change at the node N1 is then conveyed to the gate node NG1 via the gate-drain capacitance as described earlier, resulting in that the voltage of the drive signal DG1 that is changing to the high-level side voltage (VBB) is forced to fall down by being pulled toward the low-level side as shown by D2.

At this time, detecting that the voltage of the drive signal DG1 has fallen below the reference voltage VRF1, for example, the detection circuit 60 changes the level of the detection signal DET from low to high as shown by D3 and outputs the signal to the control circuit 30. Receiving the detection signal DET, the control circuit 30 changes the level of the control signal SC1 from high to low as shown by D4. This turns on the transistor TS1 of the switch circuit SW1, and thus the voltage level of the drive signal DG1 rises by being pulled toward the high-level side as shown by D5.

As described above, in the first modification in FIG. 12, when the voltage level at the gate node NG1 is pulled toward the low-level side due to a voltage change at the node N1, this event is detected and the switch circuit SW1 is turned on. Thus, occurrence of self-turn-on of the transistor Q1 can be prevented more reliably.

Note that, although the case of detecting a voltage change at the gate node NG1 by the detection circuit 60 is shown in FIG. 12, the detection circuit 60 may detect a voltage change at any of the other gate nodes NG2, NG3, and NG4 to generate a control signal for the corresponding switch circuit.

FIG. 14 shows a second modification of this embodiment. While the H-bridge type bridge circuit 10 was described with reference to FIGS. 7 and 8, the bridge circuit 10 of the second modification in FIG. 14 is of a half-bridge type. That is, while the bridge circuit 10 has four transistors Q1 to Q4 in FIGS. 7 and 8, only two transistors Q1 and Q2 are provided in FIG. 14. Also, while four switch circuits SW1 to SW4 are provided in FIGS. 7 and 8, only two switch circuits SW1 and SW2 are provided in FIG. 14. In the pre-driver circuit 20, also, only two pre-drivers PR1 and PR2 are provided. Such a half-bridge type bridge circuit 10 can drive not only a motor but also an element such as various types of inductors (coils). For example, the configuration in FIG. 14 can be applied to a switching regulator or the like that drives an inductor by switching of the transistors to generate a desired voltage.

6. DMOS Structure

In this embodiment, as described with reference to FIG. 11, transistors having a double-diffused metal oxide semiconductor (DMOS) structure are used as the transistors constituting the bridge circuit 10. Details of an example DMOS transistor will be described as follows.

Figure 15:
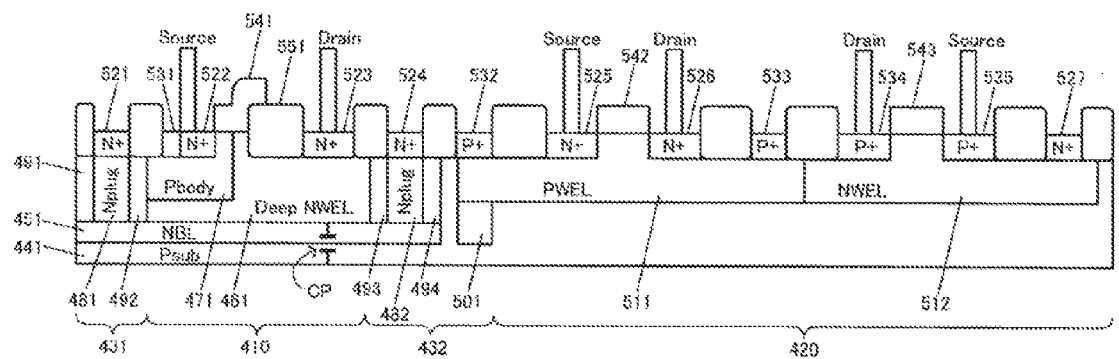
FIG. 15 shows a first example of a DMOS-structure circuit device.

FIG. 15 is a cross-sectional view of a semiconductor device as a circuit device, which is a first example of a circuit device using a DMOS transistor. Note that a description will be made hereinafter taking an N-type DMOS transistor as an example for the sake of simplicity.

In FIG. 15, provided on a substrate are a first region 410 where a first circuit is placed, a second region 420 where a second circuit is placed, a boundary region 431 provided at one end of the first region 410, and a boundary region 432 provided between the first region 410 and the second region 420. The first circuit is the bridge circuit 10 constituted by a DMOS transistor. The second circuit is a circuit constituted by a complementary metal oxide semiconductor (CMOS) transistor, which includes the pre-driver circuit 20, the control circuit 30, the switch circuits SW1 to SW4, the comparison circuit CP, the reference voltage generation circuit, etc.

In the first region 410, an N-type transistor having a DMOS structure (hereinafter referred to as an N-type DMOS) is formed. More specifically, an N-type (N+) buried layer (NBL) 451 is formed on a P-type substrate 441 that is a silicon substrate, and a deep N-type well 461 of the N-type DMOS is formed on the N-type buried layer 451. A P-type body 471 (P-type impurity layer) is formed on the source side of the deep N-type well 461, and a P-type layer 531 (P-type impurity layer) and an N-type layer 522 (N-type impurity layer) are formed on the P-type body 471. The N-type layer 522 corresponds to the source region of the N-type DMOS. An N-type layer 523 corresponding to the drain region of the N-type DMOS is formed on the drain side of the deep N-type well 461. An insulating layer 551 (e.g., LOCOS) is formed on the deep N-type well 461 so as to be in contact with the N-type layer 523, and a gate layer 541 (e.g., a polysilicon layer) is formed above the P-type body 471, the deep N-type well 461, and the insulating layer 551.

In the boundary region 431, an N-type plug 481 (N-type impurity layer) for supplying a potential to the N-type buried layer 451 is provided. More specifically, the N-type plug 481 is formed on the N-type buried layer 451, P-type layers 491 and 492 are formed on both sides of the N-type plug 481, and an N-type layer 521 is formed on the N-type plug 481. A potential given to the N-type layer 521 is thus supplied to the N-type buried layer 451 via the N-type plug 481. The same voltage as the voltage of the drain (N-type layer 523) is supplied to the N-type layer 521.

In a part of the boundary region 432 closer to the first region 410, an N-type plug 482 for supplying a potential to the N-type buried layer 451 is provided. The configuration of the N-type plug 482 is similar to that of the N-type plug 481. In another part of the boundary region 432 closer to the second region 420, a P-type (P') buried layer (PBL) 501 for supplying a potential to the P-type substrate 441 is provided. More specifically, the P-type buried layer 501 is formed on the P-type substrate 441, a P-type well 511 is formed on the P-type buried layer 501, and a P-type layer 532 is formed on the P-type well 511. The potential given to the P-type layer 532 is supplied to the P-type substrate 441 via the P-type well 511 and the ?-type buried layer 501. The low-potential side power supply voltage is supplied to the P-type layer 532.

In the second region 420, an N-type transistor (hereinafter referred to as an NMOS) and a P-type transistor (hereinafter referred to as a PMOS) of a CMOS structure are formed. More specifically, the P-type well 511 (e.g., a medium-voltage P-type well (MV PWELL)) of the NMOS is formed on the P-type substrate 441, and an N-type layer 525 and an N-type layer 526 are formed on the P-type well 511 as the N-type source region and the N-type drain region, respectively, of the NMOS. A gate layer 542 is formed above the P-type well 511 between the N-type layers 525 and 526. A P-type layer 533 for supplying a potential to the P-type well 511 is further formed on the P-type well 511. The low-potential side power supply voltage is supplied to the P-type layer 533.

An N-type well 512 (e.g., a medium-voltage N-type well (MV NWELL)) of the PMOS is formed on the P-type substrate 441, and a P-type layer 535 and a P-type layer 534 are formed on the N-type well 512 as the P-type source region and the drain region, respectively, of the PMOS. A gate layer 543 is formed above the N-type well 512 between the P-type layers 534 and 535. An N-type layer 527 for supplying a potential to the N-type well 512 is further formed on the N-type well 512. The high-potential side power supply voltage, for example, is supplied to the N-type layer 527.

When the bridge circuit 10 constituted by the DMOS transistors drives the motor with a chopping current, a large current flows to the drain (N-type layer 523) of the DMOS transistor. Since the large current is turned on/off (or the direction of the flow is reversed) by the chopping operation, the voltage of the drain largely fluctuates. The N-type layer 523 as the drain is connected to the N-type buried layer 451 via the deep N-type well 461, and a parasitic capacitance CP is present between the N-type buried layer 451 and the P-type substrate 441 due to their PN junction. Therefore, the voltage fluctuation at the drain is conveyed to the P-type substrate 441 via the parasitic capacitance CP, and then to the second region 420 via the P-type substrate 441. In the second region 420, where the P-type substrate 441 is in contact with the P-type well 511 and the N-type well 512 of the CMOS transistor, the voltage fluctuation of the P-type substrate 441 affects the circuit constituted by the CMOS transistor.

For example, in FIG. 2, the comparison circuit CP compares the voltage VS at one terminal of the sense resistor RS with the reference voltage VR, thereby keeping the chopping current flowing to the bridge circuit 10 constant. At this time, if the comparison circuit CP and the circuit that generates the reference voltage VP are affected by the voltage fluctuation of the P-type substrate 441, the reference voltage VR will fluctuate and the comparison precision of the comparison circuit CP will decrease, raising the possibility of occurrence of variations in the chopping current.

Also, a regenerative current flows from the power supply VSS toward the power supply VBB during the decay period. For this reason, the drain voltage of the transistor Q3 becomes lower than the voltage VSS (GND) due to a voltage drop of the sense resistor RS. When this occurs, in the DMOS structure in FIG. 15, the N-type buried layer 451 connected to the drain becomes lower than the voltage VSS, causing a forward voltage between the N-type buried layer 451 and the P-type substrate 441. The voltage of the P-type substrate 441 will therefore be swung with the flowing-in current. Thus, there is another cause of swinging of the voltage of the P-type substrate 441, in addition to the one occurring via the parasitic capacitance CP.

Figure 16:
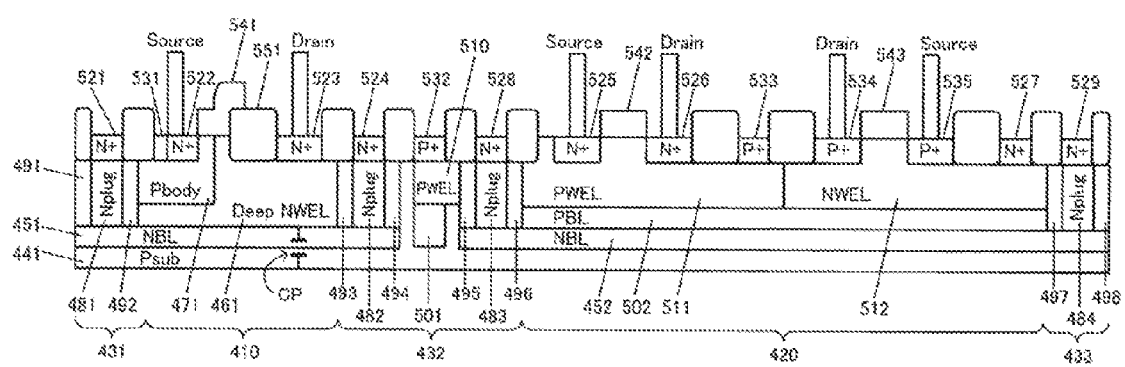
FIG. 16 shows a second example of the DMOS-structure circuit device.

FIG. 16 shows a second example of a circuit device using a DMOS transistor. The second example in FIG. 16 is to solve the problem with the first example in FIG. 15.

On a substrate, provided are a first region 410 where a first circuit is placed, a second region 420 where a second circuit is placed, a boundary region 431 provided at one end of the first region 410, a boundary region 432 provided between the first region 410 and the second region 420, and a boundary region 433 provided at one end of the second region 420.

Since the configurations of the first region 410 and the boundary region 431 are similar to those in FIG. 15, a description of these regions is omitted here.

In the second region 420, an N-type buried layer 452 for isolating the CMOS transistor from the P-type substrate 441 is formed. More specifically, the N-type buried layer 452 is formed on the P-type substrate 441, and a P-type layer 502 is formed on the N-type buried layer 452. An NMOS transistor and a PMOS transistor are formed on the P-type layer 502. The configurations of these transistors are similar to those in FIG. 15. The P-type layer 502 may be a P-type buried layer. For example, the portion of the P-type layer 502 located under an N-type well 512 may be a P-type buried layer, and the portion thereof under a P-type well 511 may be a non-buried P-type layer. Alternatively, the P-type layer 502 may be formed only under the N-type well 512, and the P-type well 511 may be in contact with the N-type buried layer 452.

In a part of the boundary region 432 closer to the first region 410, an N-type plug 482 is provided as in FIG. 15. In another part of the boundary region 432 closer to the second region 420, an N-type plug 483 for supplying a potential to the N-type buried layer 452 is provided. More specifically, the N-type plug 483 is formed on the N-type buried layer 452, P-type layers 495 and 496 are formed on both sides of the N-type plug 483, and an N-type layer 528 is formed on the N-type plug 483. The potential given to the N-type layer 528 is thus supplied to the N-type buried layer 452 via the N-type plug 483. The high-potential side power supply voltage is supplied to the N-type layer 528.

In the boundary region 432, also, a P-type buried layer 501 for supplying a potential to the P-type substrate 441 is provided between the N-type plug 482 and the N-type plug 483. The configuration of the P-type buried layer 501 is similar to that in FIG. 15, where the low-potential side power supply voltage given to a P-type layer 532 is supplied to the P-type substrate 441 via a P-type well 510 and the P-type buried layer 501.

In the boundary region 433, an N-type plug 484 for supplying a potential to the N-type buried layer 452 is provided. The configuration of the N-type plug 484 is similar to that of the N-type plug 483 in the boundary region 432, where the high-potential side power supply voltage given to an N-type layer 529 is supplied to the N-type buried layer 452 via the N-type plug 484.

With the configuration in FIG. 16, having the second N-type buried layer 452 isolated from the first N-type buried layer 451, the second circuit constituted by the CMOS transistor can be isolated from the P-type substrate 441.

When the DMOS transistor performs switching operation, the swing of the drain potential is conveyed from the first N-type buried layer 451 to the P-type substrate 441 via the parasitic capacitance CP, etc., as described with reference to FIG. 15, for example.

In regard to the above, in the configuration in FIG. 16, where the second circuit is isolated from the P-type substrate 441, even when the potential of the P-type substrate 441 swings, the second circuit is less likely to be affected by this swing, permitting operation with reduced errors.

The buried layer as used herein refers to an impurity layer formed below the impurity layers (e.g., the P-type body 471 and the deep N-type well 461 in FIG. 16) in a surface portion of the substrate. More specifically, an N-type impurity or a P-type impurity is implanted in the silicon substrate, and an epitaxial layer (silicon single-crystal layer) is grown on the impurity-implanted layer, to form a buried layer under the epitaxial layer.

In FIG. 16, the region of the second circuit (second region 420) is surrounded by the N-type plug region (the region where the N-type plugs 483 and 484 are provided as viewed from top) that sets the potential of the second N-type buried layer 452.

With the above configuration, a bathtub-shaped N-type region can be formed by the second N-type buried layer 452 and the N-type plug region surrounding the buried layer 452. By this N-type region, the region of the second circuit can be isolated from the P-type substrate 441. In addition, even if a swing of the potential of the P-type substrate is conveyed to the N-type buried layer 452, the second circuit region can be isolated without fail because the potential of the buried layer 452 has been set via the N-type plugs. There is also an advantage that, since the second N-type buried layer 452 can be set to a potential (e.g., a power supply voltage) higher than the P-type substrate 441, isolation can be ensured by reverse-voltage PN junction.

7. Electronic Apparatus

Figure 17:
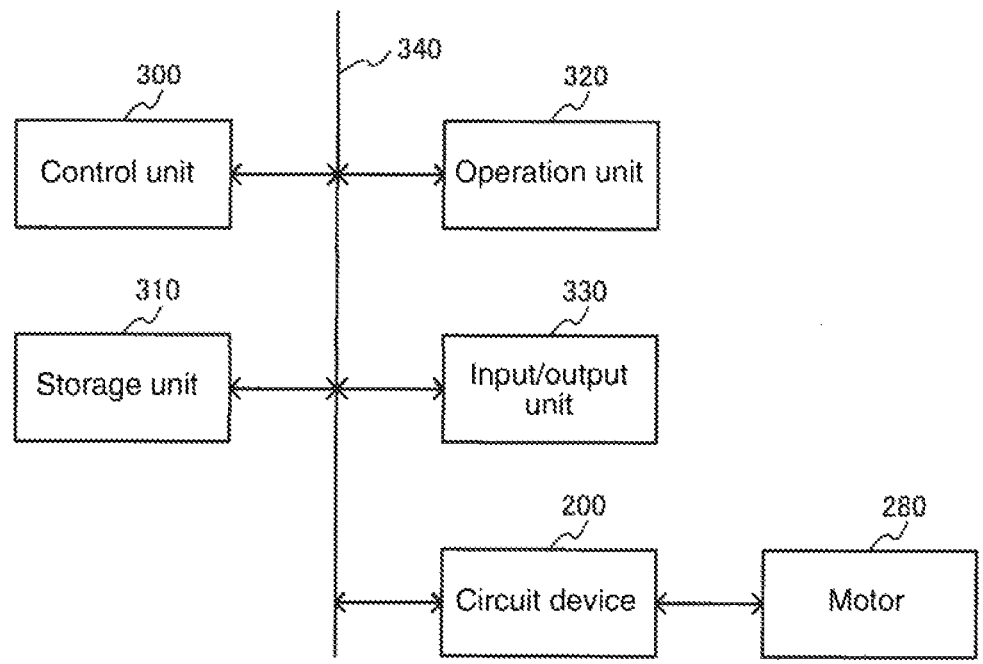
FIG. 17 shows an example configuration of an electronic apparatus.

FIG. 17 shows an example configuration of an electronic apparatus to which a circuit device 200 (motor driver) of this embodiment is applied. The electronic apparatus includes a processing unit 300, a storage unit 310, an operation unit 320, an input/output unit 330, the circuit device 200, a bus 340 that connects these units to one another, and a motor 280. Note that, while a printer where a head and a paper feeder are controlled by motor drive is to be described as an example, this embodiment is not limited to this, but can be applied to various types of electronic apparatuses.

The input/output unit 330 is constituted by interfaces such as a USB connector and wireless LAN, to which image data and document data are input. The input data is stored in the storage unit 310 which is an internal storage such as a DRAM, for example. When receiving a print instruction via the operation unit 320, the processing unit 300 starts printing of data stored in the storage unit 310. The processing unit 300 issues an instruction to the circuit device 200 (motor driver) in accordance with the print layout of the data, and the circuit device 200 rotates the motor 280 based on the instruction to execute movement of the head or paper feeding.

While a preferred embodiment of the invention has been described in detail, it is to be easily understood by those skilled in the art that various modifications that do not substantially depart from the novel matters and advantages of the invention may be made. It is therefore construed that all of such modifications are included in the scope of the invention. For example, a term having appeared together with a broader or synonymous different term at least once in the description or any drawing can be replaced with the different term at any position in the description or the drawings. Also, any combination of the preferred embodiment and the modifications is to be included in the scope of the invention. It is also to be understood that the configurations and operations of the circuit device and the electronic apparatus, the techniques of controlling the switches, the technique of driving the motor, etc. are not limited to those described in the preferred embodiment, but can be altered in various ways.

The entire disclosure of Japanese Patent Application No. 2013-061552, filed Mar. 25, 2013 is expressly incorporated by reference herein.

What is claimed is:

1. A circuit device comprising:
   a bridge circuit of an H-bridge type or a half-bridge type having a P-type first transistor provided between a node of a high-potential side power supply and a first node and an N-type second transistor provided between the first node and a node of a low-potential side power supply;

a pre-driver circuit that outputs a first drive signal and a second drive signal to a first gate node of the first transistor and a second gate node of the second transistor, respectively;
a first switch circuit provided between the node of the high-potential side power supply and the first gate node of the first transistor; and
a control circuit that performs on/off control of the first switch circuit,
wherein the control circuit keeps the first switch circuit off during a period when the pre-driver circuit is outputting a low level of the first drive signal to the first gate node of the first transistor, and turns on, from off, the first switch circuit when the pre-driver circuit has changed the first drive signal from the low level to a high level.

2. The circuit device according to claim 1,
wherein the control circuit turns on, from off, the first switch circuit at a given time after timing at which the pre-driver circuit has changed the first drive signal from the low level to the high level.

3. The circuit device according to claim 2,
wherein the control circuit turns off, from on, the first switch circuit at a given time before timing at which the pre-driver circuit changes the first drive signal from the high level to the low level.

4. The circuit device according to claim 1, further comprising:
a level shifter,
wherein the pre-driver circuit has a first pre-driver that outputs the first drive signal to the first gate node of the first transistor, and
assuming that the voltage of the high-potential side power supply is VBB, the voltage of the low-potential side power supply is VSS, and the voltage of a second low-potential side power supply located between the high-potential side power supply and the low-potential side power supply is VSS2 (VBB>VSS2>VSS),
the first pre-driver outputs the first drive signal having an amplitude range of VBB to VSS2 to the first gate node of the first transistor, and
the level shifter level-shifts the amplitude range of a control signal that turns on/off the first switch circuit to an amplitude range of VBB to VSS2.

5. The circuit device according to claim 1,
wherein the first transistor and the second transistor are high-voltage transistors, and
transistors constituting the pre-driver circuit and the first switch circuit are low-voltage transistors.

6. The circuit device according to claim 5,
wherein the first transistor and the second transistor are transistors having a DMOS structure.

7. The circuit device according to claim 1, further comprising:
a second switch circuit provided between the node of the low-potential side power supply and the second gate node of the second transistor,
wherein the control circuit keeps the second switch circuit off during a period when the pre-driver circuit is outputting a high level of the second drive signal to the second gate node of the second transistor, and turns on, from off, the second switch circuit when the pre-driver circuit has changed the second drive signal from the high level to a low level.

8. The circuit device according to claim 7,
wherein the control circuit turns on, from off, the second switch circuit at a given time after timing at which the pre-driver circuit has changed the second drive signal from the high level to the low level.

9. The circuit device according to claim 8,
wherein the control circuit turns off, from on, the second switch circuit at a given time before timing at which the pre-driver circuit changes the second drive signal from the low level to the high level.

10. The circuit device according to claim 1, further comprising:
a detection circuit that detects a change in voltage level at the first gate node of the first transistor,
wherein the control circuit generates a control signal that turns on/off the first switch circuit based on a detection result from the detection circuit.

11. The circuit device according to claim 1,
wherein the bridge circuit is an H-bridge type bridge circuit further having a P-type third transistor provided between the node of the high-potential side power supply and a second node and an N-type fourth transistor provided between the second node and the node of the low-potential side power supply,
the circuit device further includes:
a third switch circuit provided between the node of the high-potential side power supply and a third gate node of the third transistor; and
a fourth switch circuit provided between the node of the low-potential side power supply and a fourth gate node of the fourth transistor, and
the control circuit keeps the third switch circuit off during a period when the pre-driver circuit is outputting a low level of a third drive signal to the third gate node of the third transistor, turns on, from off, the third switch circuit when the pre-driver circuit has changed the third drive signal from the low level to a high level, keeps the fourth switch circuit off during a period when the pre-driver circuit is outputting a high level of a fourth drive signal to the fourth gate node of the fourth transistor, and turns on, from off, the fourth switch circuit when the pre-driver circuit has changed the fourth drive signal from the high level to a low level.

12. An electronic apparatus comprising the circuit device according to claim 1.

* * * * *